US005181026A

United States Patent [19]
Granville

[11] Patent Number: 5,181,026
[45] Date of Patent: * Jan. 19, 1993

[54] POWER TRANSMISSION LINE MONITORING SYSTEM

[75] Inventor: J. Michael Granville, Saugus, Calif.

[73] Assignee: Granville Group, Inc., The, Saugus, Calif.

[ * ] Notice: The portion of the term of this patent subsequent to Apr. 9, 2008 has been disclaimed.

[21] Appl. No.: 632,249

[22] Filed: Dec. 19, 1990

Related U.S. Application Data

[63] Continuation-in-part of Ser. No. 464,707, Jan. 12, 1990, Pat. No. 5,006,846.

[51] Int. Cl.$^5$ .............................................. H04B 9/00
[52] U.S. Cl. ........................... 340/870.28; 340/870.17; 340/870.29; 324/96
[58] Field of Search ...................... 340/870.28, 870.17, 340/870.29, 310 R, 538, 658, 657, 660, 664; 324/126, 127, 142, 117 R, 96; 364/481, 483, 492; 323/357; 361/93, 91; 385/26; 359/173, 179

[56] References Cited

U.S. PATENT DOCUMENTS

| | | | |
|---|---|---|---|
| 3,506,833 | 4/1970 | Willesen | 340/870.29 |
| 3,629,703 | 12/1971 | Bernard | 340/870.29 |
| 3,991,367 | 11/1976 | Chapman et al. | 340/870.29 |
| 4,158,810 | 6/1979 | Leskovar | 340/870.17 |
| 4,471,355 | 9/1984 | Hardey et al. | 340/870.29 |
| 4,578,639 | 3/1986 | Miller | 324/96 |
| 4,709,339 | 11/1987 | Fernandes | 340/870.17 |
| 4,758,962 | 7/1988 | Fernandes | 340/870.17 |

Primary Examiner—Donald J. Yusko
Assistant Examiner—Edwin C. Holloway, III
Attorney, Agent, or Firm—David O'Reilly

[57] ABSTRACT

An Electric Power Line Monitoring System in which a single line measuring system station can measure all of the power parameters of both voltage and phase angle plus ambient and line temperatures. The measuring station can be secured to the power line without the need for shutting down the line. The measured data is transmitted from the measuring station on the power line to a ground receiving and data processing station. The system measures true RMS voltage and current values, RMS phase angle along with ambient and line temperatures which are digitized and transmitted through a digital fiber optic data link. The fiber optic data transmission line can be a flexible fiber optic cable assembly or a rigid fiber optic bushing assembly for supporting a long phase conductor that also contains a long resistive link of a voltage sensor voltage divider. The resistive link is constructed of materials that have a high precision resistance tolerance and low temperature coefficients of resistance that improved the accuracy of the voltage sensor.

44 Claims, 4 Drawing Sheets

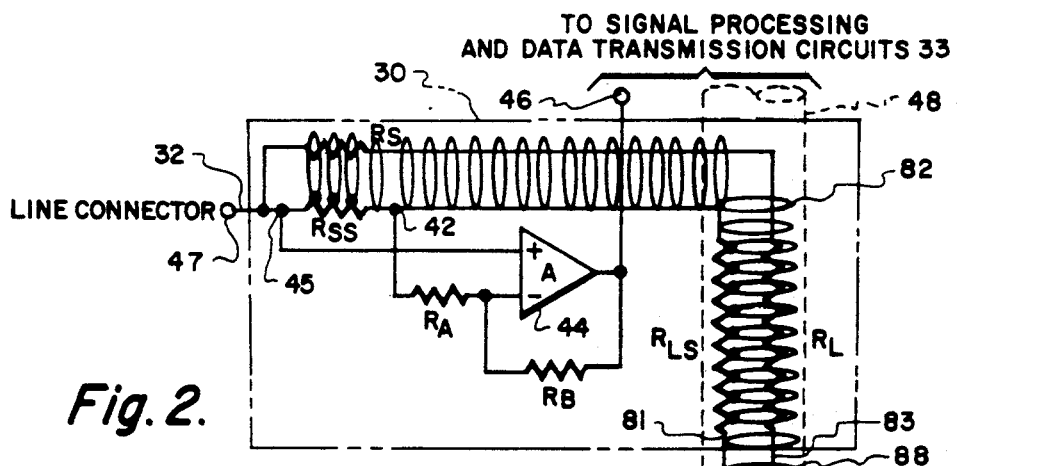
Fig. 2.
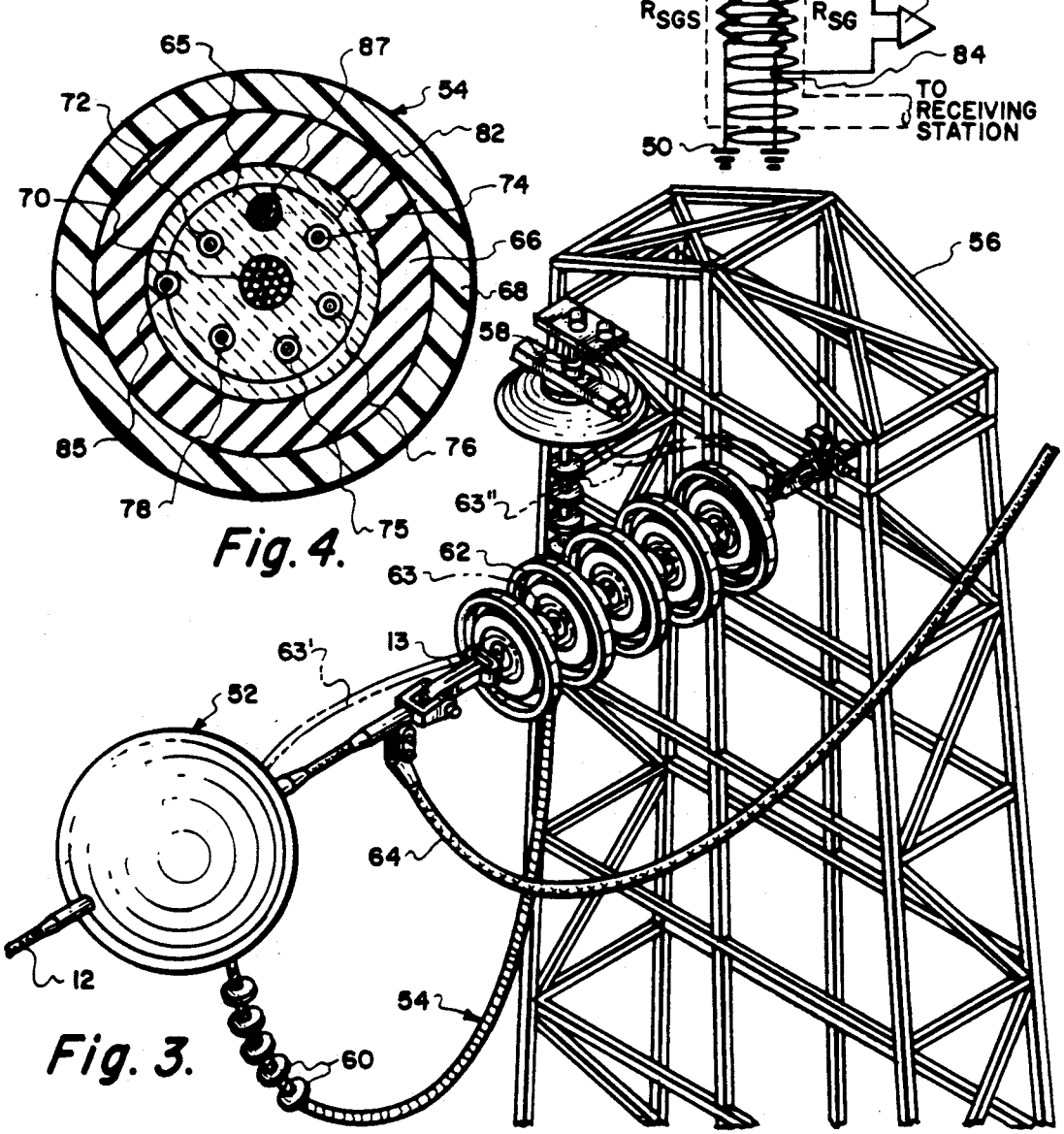
Fig. 4.
Fig. 3.

POWER TRANSMISSION LINE MONITORING SYSTEM

This is a continuation in part of co-pending application Ser. No. 07/464,707 filed Jan. 12, 1990, now U.S. Pat. No. 5,006,846.

FIELD OF THE INVENTION

This invention relates to power transmission line monitoring systems and more particularly relates to a power transmission line power monitoring system using a unique voltage divider technique for monitoring voltage, in addition to the monitoring of the other power parameters of current, of the electric field phasor, and of the phase angle between the current and the electric field phasor, plus the line and the ambient temperatures, with fiber optic or other means for transmitting the measured data to the ground, and with the capability to generate electrical power for the line measuring station circuitry from the line and/or from the ground using a radiant energy unit employing a unique radiant energy transmission technique.

BACKGROUND OF THE INVENTION

Power line transmissions are extremely difficult to monitor accurately because of the high voltages and currents flowing through the lines. Heretofore massive costly structures were needed to connect high voltage lines to ground to obtain accurate voltage measurements. These devices employ potential transformers (PT's) or coupling capacitor voltage transformers (CCVT's), which only measure voltage, mounted on a massive insulated standoff supported by a ground base. Just one of these systems can cost as much as $20,000 or more in 1986 dollars for a single two hundred kilovolt phase conductor.

Voltage in many power transmission lines is measured with a PT or CCVT while current measurement heretofore has required the use of a separate device, typically a current transformer (CT). Voltage and current transformers are used for revenue metering when accuracy better than 0.3% is desirable, and for protective relaying where fast circuitry response and interference free data transmission are desirable. These PT/CCVT and CT transformers are massive in design and structure because they must be in direct contact with the high voltage line on the primary side, and with earth or ground potential on the secondary side where the voltage current measurement is made. The ground side of the PT and CT transformers typically uses ohms per centimeter to physically bridge the voltage gradient. These porcelain high resistance bushings in order to have sufficient insulation to bridge power company line to ground voltage gradients of up to roughly 500 kilovolts (KV) are tall, about 20 feet, and thus are concomittantly massive and costly. In addition, the accuracy of these devices is limited and not typically within the 0.3% desired.

Additional problems with recording the data from a PT/CCVT are that cables leading from these devices to metering or relaying equipment located elsewhere can sometimes pick up high frequency noise which can interfere with optimal operation of relay, control and metering equipment. These effects further increase costs and also reduce the efficiency of the systems.

Another disadvantage is the high cost of installing these transformers, and maintenance operations on them, which require costly high voltage power line outage time since the power transmission line must be disconnected from use while installation or maintenance proceeds. These transformers are also used to derive the phase angle of the power by processing the output of a PT transformer and separately a CT transformer, at separate processing equipment located some distance from the PT and CT. With such two linear outposts delivering data from two different and independent transformers being transmitted over a distance into a third processing station, accuracy of course is limited and the costs can be significant.

Another method of measuring transmission line voltage is by use of an electrostatic voltmeter, also called a capacitive voltmeter which is a non-contact instrument for measuring electric field magnitude and direction over time. While these devices can be used to measure high voltages, such as 5-120 KV (kilovolts), they have never been widely accepted for use by the power industry due to the lack of accuracy in and stability of the measurement of the magnitude of the power line electric field and the need to convert electric field magnitude to voltage.

Of two other devices for monitoring certain parameters of power transmission lines, one is in the shape of a toroid, and a second is in the shape of a shoebox. Both are freely mounted on and in contact with a transmission line. The toroid has circuitry which measures voltages and phase angle and both devices measure current and conductor surface and ambient temperature and transmit the information to a remote ground station via a radio data link. These systems are line powered and self-contained modules. Line temperature and line current are needed to calculate the dynamic thermal line rating. The sensing device mounted in the housing on the transmission line includes a radio frequency (RF) transmitter transmitting measured information to a ground station where it is then processed. The shoebox device is not without problems since it does not measure voltage and thus, cannot measure phase angle. The toroidal device is also not without problems because the voltage sensor, employing an electrostatic voltmeter, rather than a more accurate PT or CCVT, has accuracy typically of only about plus or minus 5% at best. Such accuracy is typically not adequate for most power company revenue metering and protection and load management or networking purposes.

Also, since both the shoebox and the toroidal line measuring devices are powered solely by the power line, via a small current transformer, when the power line goes down, the line current drops to zero amperes, and thus both devices cease to operate. That inoperable condition is acceptable for some applications, but not for system protection applications. In those applications, even if the line is out of service for up to one year, it is desirable for the sensors to be kept fully operating at all times, so at the first instant current is sent back into the line, the sensors are already in operation and can detect any faults. Thus, in a system protection application there is no time allowed for the sensor and its circuitry to turn on and warm up after being off. Typically, a fault is defined as an excess current event lasting longer than 1/10 of a 60 Hz cycle (1.6 milliseconds).

An additional problem with these systems is the use of radio frequency data links as the sole means to transmit data from the power line down to ground station receivers which use radio frequencies requiring a Federal Communications Commission (FCC) license. Obtaining such a license can be difficult for power companies operating in urban areas already crowded with radio transmissions which may need, for example, twenty or more transmitters, and thus twenty or more licenses. Of the two transmission line "hot-stick" mounted toroidal or "shoebox" housed systems on the market, one offers only a radio link at 450 megahertz (MHz) and the other offers only a radio link at 926 MHz, both frequencies of which require a separate FCC license; no other data links, such as optical-through-air or fiber optic are offered in either system.

Though known available transformer systems provide accurate voltage measurement for metering or protective relaying, these existing state of the art PT and CT transformers are large and massive and thus expensive to buy, ship and install. Additionally, during installation or repair, they also require a line outage in which all adjacent equipment and the transmission lines they are to be connected to must be shut down. Installation further requires the use of an overhead crane to lift the heavy transformers and many skilled tradesmen to prepare structural concrete mounting pads and other equipment. Thus these PT and CT devices are extremely expensive to install on transmission lines. These systems are reliable over long periods in that they can last as much as forty years or so; however, their accuracy will drift over years of field use and there is no economically and technically feasible way to recalibrate them in the field. If a power company is metering $100,000,000 of power delivered on a line to a customer, and the metering system drifts off by one percent (1%) or more over a long period of field use, the errors can be in megadollars.

It is therefore, the object of the present invention to provide a power line monitoring system which is accurate, reliable and stable for installation and long term use on power transmission lines to monitor and measure line voltage, line current, line electric field phasor, line temperature, ambient temperature and phase angle.

In this line monitoring system, the measurement of the power line the voltage sinusoidal waveform over time, including the timing of the of the voltage sinusoidal waveform over time, including the timing of the positive-going and of the negative-going peaks and zero-crossings of the sinusoidal waveform, is done using the electric field (units of volts per meter) phasor measured by an electrostatic field meter which is attached to the power line and is referenced to the earth ground, rather than by using the voltage sensor which is referenced to the line, not to the earth, and which employs a voltage divider technique to measure voltage, and thus the phasor of the voltage measured by the voltage sensor voltage divider may be slightly but unfavorably changed by the effects of steady state or transient capacitive and resistive currents which can exist near or along the length of the voltage divider, and thus can capacitively be coupled to the voltage divider current.

Phase angle is the angle in degrees between comparable points of the current and electric field phasor waveforms. One degree is 1/360 of a single full alternating current (AC) cycle. Typically the time between, for example, the zero crossing of the negative going current sinusoid and the zero crossing of the negative going electric field phasor sinusoid is measured. That time period is converted to degrees of phase angle phi ($\phi$). The value (cosine $\phi$) is the power factor. Power (P) equals the product of current (I) voltage (V) and power factor (cos $\phi$) with current and voltage expressed in true RMS units. Thus:

$$P = IV \cos \phi$$

For $\phi = 0$ degrees, cos $\phi = 1$, and there are no reactive losses. If the current leads the electric field by 10 degrees, the power factor cos $\phi = \cos(10°) = 0.985$ and the load is capacitive. If the current lags the electric field by 10 degrees, the power factor cos $\phi = \cos = (10°) = 0.985$ and the load is inductive.

It is yet another object of the present invention to provide a power line monitoring system which is compact and inexpensive enough to be easily mounted on transmission lines without interrupting line use.

Yet another object of the present invention is to be a power line monitoring system using an elegantly simple voltage divider technique to provide accurate independent metering of voltage.

Yet another object of the present invention is to provide a power line monitoring system which measures line voltage, line current, line electric field phasor, line phase angle, and line and ambient temperatures using electronic sensors in contact with the high voltage transmission lines.

Still another object of the present invention is to provide a power line transmission monitoring system with a measuring station mounted directly on the power line, directly communicating with a ground receiving and data processing station located nearby.

Still another object of the present invention is to provide a power transmission line monitoring system having a measuring station connected to the ground by a fiber optic data transmission cable transmitting linear (analog) and/or digital voltage, current, electric field phasor, phase angle and temperature measurement data. The phase angle is derived from comparing the current waveform data to the electric field phasor waveform data.

Yet another object of the present invention is to provide a power transmission line monitoring system using a simple voltage divider, composed of a series of discrete resistances which are assembled into a very large ohmic resistance, incorporated into a fiber optic cable link forming a unitized resistive link/fiber optic cable assembly. Thus the fiber optic cable assembly serves as both a data link to transmit data from the line to the ground, and also as a means of containing the voltage sensor voltage divider large ohmic resistance resistive link, which resistive link has a fixed connection to the line at line potential at one end and a fixed connection to the ground at ground potential at the other end across the voltage gradient.

Another object of the present invention is to provide a transmission line monitoring system having a fiber optic data transmission cable assembly containing a multiplicity of optical fibers some of which transport data, and some of which transport or propagate radiant energy. This radiant energy is radiated from one or more ground based radiant energy sources and then is coupled into an optical fiber bundle, which transports the radiant energy from the ground up to the line measuring station on the power line, where it is converted from radiant into electrical energy to provide electrical power for the line measuring station circuitry either for normal operation, or for just those times when the power line is out of service, and thus has zero line current, and thus there is no current available to power a CT within the line station which might be the normal source of line circuitry power when the line is energized.

Another object of the invention is to avoid the severe costs and operating complexities attendant with the massive high voltage to ground bridge structures of potential transformers and current transformers.

Yet another object of the present invention is to avoid the costs and operating complexities of present systems by measuring line voltage, current, electric field phasor, phase angle, phase conductor temperature and ambient temperature using electronic sensors employing components which are inexpensive and can be located within a single monitoring system measuring station located on and in contact with high voltage transmission lines.

Still another object of the present invention is to provide a live-line (no line outage) installation of a transmission line monitoring system which can easily be installed or removed using electric power industry manual "hot-stick" apparatus to effect a hook-on installation to the power line or a hook-off removal from the power line of the line measuring station without interrupting the power line.

Still another object of the present invention is to provide a power line monitoring system which will eliminate the requirement for a dedicated potential transformer to measure voltage and a separate independent current transformer to measure current. This is accomplished by measuring line voltage, current, electric field phasor, phase angle, temperature, and ambient temperature from a single solitary measuring station.

Still another object of the present invention is to process and transmit real time analog line voltage and current and electric field phasor waveform data (and in some cases perhaps temperature data) to the ground using linear (analog) fiber optic or radio or optical-through-air transmitters and receivers with only group (speed of light) delay of typically only 20-50 nanoseconds in order to minimize delay time for purposes of fast system protection relaying and circuit breaking where the goal is to detect voltage and/or current faults as quickly as possible which means in some cases in less than 1 AC cycle of 16.7 milliseconds (ms).

Yet another object of the present invention is to provide a transmission line monitoring system which can transmit data to ground based receiving stations through a three purpose data transmission cable incorporating a resistive link filament, and optical fibers some of which optical fibers are transporting data and some of which are transporting radiant energy.

Yet another object of the present invention is to provide a power line transmission monitoring system which can digitize raw analog voltage, current, electric field phasor, phase angle and line and ambient temperature data, either before or after data transmission from the power line measuring station to the ground based receiving and data processing station. Digital circuitry incorporated in the monitoring system may be dedicated to processing one parameter or may be shared by two or more parameters using multiplexing means depending upon how often parameter data is taken, digitized and transmitted. With multiplexing, one data link can time-sequentially transmit multiple data parameters. Typically the data is digitized up in the power line measuring station. Typically the data digitized is true RMS line voltage, true RMS line current, phase angle, line and ambient temperatures for purposes of metering and networking/load management.

Still another object of the present invention is to provide a transmission line monitoring system having a duplexing fiber optic cable link which allows simultaneous two-way flow of data, to and from the ground. Thus, a command and control computer on the ground can be connected to the fiber optic cable assembly to send and receive diagnostic and calibration data to and from the monitoring system measuring station connected to the high voltage power line phase conductor.

Yet another object of the present invention is to provide a transmission line monitoring system providing accurate measurement of voltage using a voltage divider technique and enhancing the accuracy of the voltage sensor by providing circuitry to correct for the effect of changes in the resistance in ohms of the voltage divider as a function of changes in ambient temperature and/or by employing a resistive link whose resistance has a very high tolerance and a very low temperature coefficient of resistance (TCR). In describing a resistor with, for example, a 0.1% or 0.01% tolerance, the words very high tolerance or precision tolerance or very close tolerance are all synonymous.

Still another object of the present invention is to provide a transmission line monitoring system providing accurate measurement of voltage using a voltage divider technique and enhancing the accuracy of the voltage sensor by providing two circuitry devices: the first of which reduces the effect of stray capacitance on the voltage sensor voltage divider; and the second of which corrects for the effect of stray capacitance on the voltage sensor voltage divider, which effect is the loss of voltage divider current along the length of the voltage divider caused by the stray capacitance. The first device reduces the effect of stray capacitance on the voltage sensor voltage divider resistive link by providing an outer shield around the divider, maintained at the same voltage potential as the divider. This shield is composed of a series of electrically conductive rings, which form a series of equipotential planes, spaced at intervals along the length of the voltage divider with each ring separated from the next and encapsulated within a surrounding matrix of electrically insulating material. Since the voltage divider typically drops straight down vertically from the overhead power line, these shield rings form a series of equipotential horizontal planes spaced at vertical intervals from one another. The second device corrects for the effect of stray capacitance on the voltage sensor voltage divider by directly measuring the relevant effect of stray capacitance, which is the amount of current lost across the voltage divider resistive link. If for example 10% of the current is lost, the voltage sensor will read 10% too high. Thus, that high reading can be corrected by multiplying the reading by the ratio of: the current magnitude measured at the bottom of the voltage divider resistive link divided by the current magnitude measured at the top of the voltage divider resistive link, which equals $0.9/1.0 = 0.9$.

Yet another object of the present invention is to incorporate the fiber optic data transmission cable elements inside an otherwise conventional rigid high tension insulation bushing to form a single rigid fiber optic cable insulation bushing assembly, with outer insulating sheds to provide a favorably large creepage distance, and composed of materials which not only have high mechanical strength and rigidity, but which also have a high dielectric coefficient, and thus provide the necessary electrical insulation between the high voltage power line at one end and the earth ground voltage at the other end of this assembly, hereinafter called the rigid fiber optic bushing assembly. Thus, this assembly performs three different functions: to mechanically support the high tension load of the suspended power line phase conductor, to electrically insulate the line from the ground, and to contain the fiber optic data transmission cable assembly which comprises the voltage sensor voltage divider resistive link plus a multiplicity of optical fibers for data transmission plus other optical fibers for radiant energy transmission.

BRIEF DESCRIPTION OF THE INVENTION

The purpose of the present invention is to provide a power transmission line monitoring system which can measure line voltage, line current, line electric field phasor, line temperature and ambient temperature, determine the phase angle between the current waveform and the electric field phasor waveform, and which has the option of either fiber optic or radio or optical-through-air transmission of data from the power line measuring station to the ground receiving and data processing station in a configurable system consisting of all and only those sensors and circuitry required for each application.

The system of the present invention uses a current transformer to inductively draw electromagnetic energy from the line. The transmission line forms the one-turn primary of the transformer and if, for example, the multi-turn secondary has 1,000 turns, then the transmission line current is exactly transformed or reduced by a factor of 1000. This current output from the secondary windings of the current transformer is then rectified and fed to a power supply.

Alternatively, energy to power the line sensors and transmitters and control circuitry can be provided by a Radiant Energy Unit (REU). The REU consists of a ground based radiant energy source, such as an incandescent lamp or laser diode, coupled typically via an optical lens system, into a bundle of optical fibers, which may be plastic or glass material, which carry the energy up to the line station where the radiant energy beam is aligned with and spread or diverged over the receiving area of a photovoltaic array, typically an array of silicon photovoltaic cells, which converts the radiant energy into electrical energy. That electrical energy is then fed to a power supply to power the line measuring station circuitry.

A line current sensing circuit, whose sense resistor lies in the system return, senses the transformed line current. Also included in the design are temperature sensing transducers mounted in contact with the transmission line phase conductor and in contact with the ambient air to sense the line temperature and the ambient temperature which data are then fed to a temperature sensing amplifier circuit for processing. The entire monitoring system is mounted within a housing pod which can be fastened to power transmission line phase conductors using a standard device known as a "hot-stick" which enables a rotary wrenching or pulling mechanical action to tighten or clamp the housing securely in compression onto the phase conductor, or to close the housing pod around the circumference of the phase conductor.

The measuring station circuitry system return is referenced to and attached to the transmission line. Thus, an observer located within the frame of reference of the measuring station up on the overhead transmission line observes the earth's potential changing sinusoidally at 60 Hz and equal in magnitude and having reversed polarity (positive or negative potential) as that line potential observed by an observer on the earth.

The measurement of phase angle compares the current phasor, the direction and slope of the current sinusoidal waveform over time, relative to the electric field phasor, which electric field phasor is relative to the earth ground, not to the power line. Thus the electric field phasor is the phase reference by which the other phasor, that of current is measured. If a phase angle measurement were to compare the current phasor with the voltage sensor phasor, there may tend to be an error in the voltage sensor phasor, since the voltage sensor is referenced to the power line, not to the earth ground, and its phasor may be affected by resistive and capacitive currents near and/or along the lengthy voltage divider resistive link from the line across to the ground. Such a measurement might potentially provide useful data indicating the steady state and/or transient effects of capacitive and resistive currents, present near and/or along the voltage sensor voltage divider, capacitively coupled to the voltage divider current. With that potential use in mind, the line measuring station block diagram described in detail hereinafter does show an output analog data path from the line voltage sensing circuit over to the phase angle sensing circuit.

Thus, for improved phase angle measurement accuracy, the current phasor is compared with the electric field phasor, which electric field phasor is sensed by an electrostatic field meter, which, although physically a part of the power line measuring station attached to the power line, measures the electric field, in units of volts per meter, over time to provide a phase reference phasor of the power line voltage referenced to the earth.

Additionally, the line voltage is sensed by a unique voltage divider technique which uses a resistive link comprising a small precision sensing resistor connected to the measuring station system return in series with a very large ohmic value load resistance resistor which forms a physical bridge connection to earth ground. Voltage sampling at the junction of the two resistors provides accurate voltage measurement for input to signal processing circuits, said accuracy being improved by using resistive link resistance devices which have low temperature coefficients of resistance. Said accuracy is also improved by reducing the effect of stray capacitance via a unique twin resistance resistive link shield circuit device, along whose length are fastened a series of electrically conductive outer shield rings. These shield rings are spaced at close intervals along the entire length of the resistive link, and each ring fully encloses, that is, forms a closed path around, a segment of the length of the voltage sensor voltage divider resistive link. And, each ring is held at the same voltage potential as that of the enclosed segment of the voltage sensor voltage divider resistive link. Said accuracy is further improved by a unique voltage sensor voltage divider resistive link stray capacitance correction circuit which multiplies the initially measured uncorrected voltage reading by a correction factor which is the ratio of the current magnitude measured at the bottom or ground end of the divider divided by the current magnitude measured at the top or line end of the divider.

The large load resistance is a resistive link of a long resistance element, typically of a filamentary shape, or of multiple individual discrete resistor elements in series, connected between the measuring station housing pod and earth ground at which there is a secure mechanical connection. The earth ground electrical terminus and the physical terminus of the earth end of the resistive link can be made at a location up in the transmission line tower or down on the ground.

Thus the resistive link has a fixed connection to the line at line potential at one end and a fixed connection to the line at line potential at the other end across the voltage gradient; that arrangement of fixed end points satisfies the physics of measuring voltage since voltage, a scalar quantity in physics, is defined as the line integral of the vector electric field over a length vector between two points in space with the value of the integral not being dependent on the path between the two points but only dependent on the spatial position of the two points.

The load resistance can be a long flexible line of high precision tolerance, low temperature coefficient of resistance (TCR), high resistance discrete resistor elements in an assembly forming a long flexible resistive link filamentary element hanging from the measuring station housing pod at one end, and connected to the transmission tower or other ground terminus at the other end.

In most applications, the large load resistance is a long resistive link housed within a unique fiber optic cable assembly containing optical fibers for transmitting collected data from the monitoring system measuring station to the ground receiving and data processing station, and/or for transmitting command and control and diagnostics data in a two way or duplex data transmission mode between the line measuring station and the ground receiving station, and/or having other optical fibers for propagating radiant energy emitted down at the ground station up to the line measuring station to provide energy to operate the line measuring station circuitry. Thus, the large load resistance may be configured and incorporated with the fiber optics into a unique fiber optic cable assembly to accomplish one of or any combination of 3 functions: a data link between the line measuring station and the ground receiving station, and/or the transport of radiant energy from the ground up to the line via an optical fiber bundle, and/or the containment of the voltage sensor voltage divider large resistance resistive link.

Said three function fiber optic cable assembly data transmission line can be a flexible cable assembly, bridging across the voltage gradient from the line measuring station to the ground receiving and data processing station, and mechanically supporting its own weight, with the mechanical strength to sustain dynamic loads including vibration and wind and static loads from ice build up on the outside of the cable assembly.

Also said three function fiber optic data transmission assembly can be incorporated into an otherwise conventional high tension high voltage insulating bushing which supports the high tension load of the suspended power line phase conductor. The resultant assembly is called herein a rigid fiber optic bushing assembly.

Line current, voltage, electric field phasor, phase angle, temperature and ambient temperature sensing circuits provide outputs to a signal processing and data transmission circuit. The signal processing and data transmission circuit provides an electronic processing passage which includes an analog to digital converter and optical modulator and a multiplexer for converting the RMS voltage, RMS current, and RMS phase angle plus the temperature circuit outputs to proper form for serial transmission in digital multi-bit word packets to a ground based receiving station. Additionally, real time analog and fast digital voltage current and electric field phasor waveform data is processed by analog and by digital circuitry and transmitted down to the ground station by analog and by digital fiber optic or radio or optical-through-air transmitters and receivers.

The current transformer and system return are incorporated into a housing which can be clamped on or closed over a transmission line without interrupting power. A rotary wrenching action or linear pulling action or other action of the "hot-stick" can rotate an acme screw or snap a jaw closed or activate another type of mechanism to close the housing around the line, and also close the current transformer around the line, and also clamp the system return and the line temperature sensor to the line. The large resistance of the voltage divider circuit being connected at the monitoring system measuring station end to the power line and at its other end to the power line tower, or other ground location, now provides accurate voltage measurement. The monitoring system will accurately measure the line voltage, current, electric field phasor, phase angle, temperature and ambient temperature; and thus, the ground receiving and data processing station can supply the data needed to make comparisons between two or three phase conductors on a single power line or between two or more power lines in an electric power transmission and distribution grid. The system can provide information for purposes of measuring line ampacity, establishing a dynamic thermal line rating, revenue metering, fault detection/protective relaying, load/energy management, networking, data acquisition including waveform data, automation and supervisory control. A typical monitoring system is attached directly to each power line phase conductor without interrupting operation and takes data measurements which are processed and sent over a data link to a ground based receiving station at ground potential.

The above and other novel features and advantages of this invention will be more fully understood from the following detailed description and the accompanying drawings:

BRIEF DESCRIPTION OF THE DRAWINGS

FIG. 2 is a diagram semi-schematic form illustrating the unique voltage sensing circuitry of the system.

FIG. 3 is a diagram illustrating the installation of a power line transmission monitoring system on an existing power line phase conductor.

FIG. 4 is a cross-sectional view of a cable incorporating a large resistance and optical fibers.

DETAILED DESCRIPTION OF THE INVENTION

Figure 1A:
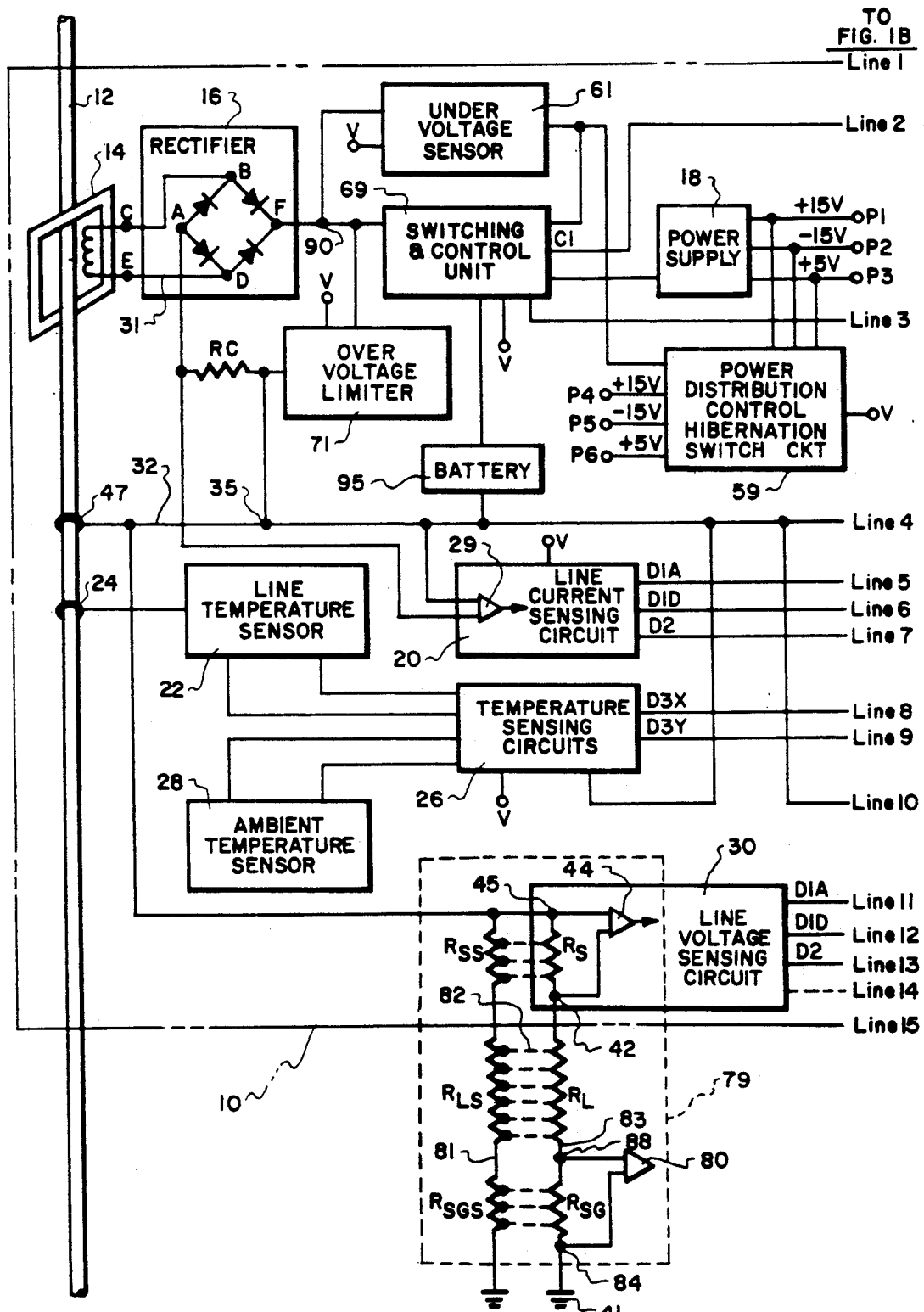
FIGS. 1A and 1B are block diagrams illustrating the power transmission line monitoring system.

The system described is a power line monitoring system for measuring conductor line voltage, current, electric field as a function of time referenced to ground hereinafter described as the electric field phasor, phase angle between the current and the electric field phasor, temperature, and ambient temperature. The system can be used for power transmission and distribution applications including measuring ampacity and establishing dynamic thermal line rating, measuring harmonics, revenue metering, system protection/fault detection/protective relaying, load/energy management, networking, data acquisition including waveform data, automation and supervisory control. The monitoring system is attached directly to each high voltage power transmission phase conductor line to take the data measurements which then are sent through a fiber optic data link to a ground based receiving station for processing. Optionally the data can be transmitted via radio transmissions to a ground receiving station when the monitoring system measuring station is in a remote location or a location where ground electric power is not available. Alternatively, an optical-through-air data link could be used. In that case a light emitting diode (LED) or laser transmitter would be placed at 37 in FIG. 1 and aimed at the ground receiving station in alignment with a receiving lens or other suitable optical means aligned to refract, focus, absorb, and detect the received light beam.

The monitoring system in the block diagram of FIG. 1 has voltage, current, electric field phasor, phase angle, and temperature sensing devices mounted in measuring station housing pod 10 which will be described in greater detail hereinafter. Current and power from a current transformer 14 fully encircling transmission line phase conductor 12 is fed to rectifier 16 which provides outputs to power supply 18 and line current sensing circuit 20. Alternatively, radiant energy from a ground based radiant energy unit source, shown as LAMP form 86, which is located in the receiving and data processing station 38, can be fed up through optical fiber bundle OFB into photovoltaic cell array 96 for conversion into electrical power to supply the line station sensor and processing and transmitter circuitry.

A line temperature sensing device 22 is clamped at 24 around transmission line 12 providing line temperature readings to temperature sensing amplifier circuits 26. The temperature sensing circuit amplifier circuit 26 also receives an input from an ambient temperature sensing device 28 which is in contact with the ambient air surrounding the measuring station housing pod 10 in such a way that the sensing device and the air around it is "in the shade," that is, not directly exposed to the radiant heating effects of direct sunlight radiation and also not directly exposed to the heat from the power line since transmission lines can operate up to 100 degrees Centigrade. The output of the phase angle sensing circuit 39 is shown as analog data path D4 to signal processor and data transmission circuits 33. The output of temperature sensing amplifier circuits 26 is shown as data paths D3X and D3Y which are the analog data output paths to the signal processor and data transmission circuits 33 for the line and ambient temperatures, respectively.

The measuring station system also includes line voltage sensing circuit 30 which is a voltage divider connected at one end to the line measuring station circuitry system return line 32. which is directly connected to the transmission line at 47. and to earth ground at the other end. Earth ground is shown as 41. or as 50, depending on whether the voltage divider is separate from, or integrated within, respectively, the fiber optic data link 34. The voltage divider is shown within phantom lines 79.

The three outputs of voltage sensing circuit 30 and of the line current sensing circuit 20 are shown as data paths D1A and D1D and D2. D1A is real time waveform analog (linear) data output, and D1D is nearly real time fast digital waveform data output from voltage sensing circuit amplifier 44, and from current sensing circuit buffer amplifier 9, to the signal processor and data transmission circuits 33 for analog modulation and transmission by an analog data link, which data link can be fiber optic 34, radio 36, or optical-through-air 37, or for analog to digital conversion and digital modulation and transmission by a digital data link, which data link also can be fiber optic 34 radio 36, or optical-through-air 37. D1A and D1D are typically used for applications, such as system protection where the instantaneous values of voltage and current are of interest, typically to provide protective relays and other downstream equipment the instantaneous values of voltage and current so circuit breakers can be opened, for example, in the event of a fault on the power line. By nearly real time, or fast digital, is meant that the analog to digital, or A/D, conversion time of the A/D converter integrated circuit device is roughly 10 microseconds for a 12 bit measure sample. Such a device, for example, with a 10 microsecond A/D conversion time, could generate about 1,600. 12 bit measure samples of voltage or current per each AC cycle of 60 Hz.

Analog waveform data paths D1A and fast digital waveform data paths D1D each have certain advantages and disadvantages. For example, while the use of digital D1D data avoids any analog linearity or noise issues, there is the requirement for the A/D conversion circuitry to be located within the line measuring station 10 in FIG. 1 up on the power line, and for the delay inherent in the A/D conversion time.

D2 is a true RMS analog data output from voltage sensing circuit buffer amplifier 44 or other buffer means, and from current sensing circuit buffer amplifier 29 or other buffer means, to the signal processor and data transmission circuits 33 for digital modulation and transmission by a digital data link which data link can be fiber optic, radio, or optical-through-air.

Figure 1B:
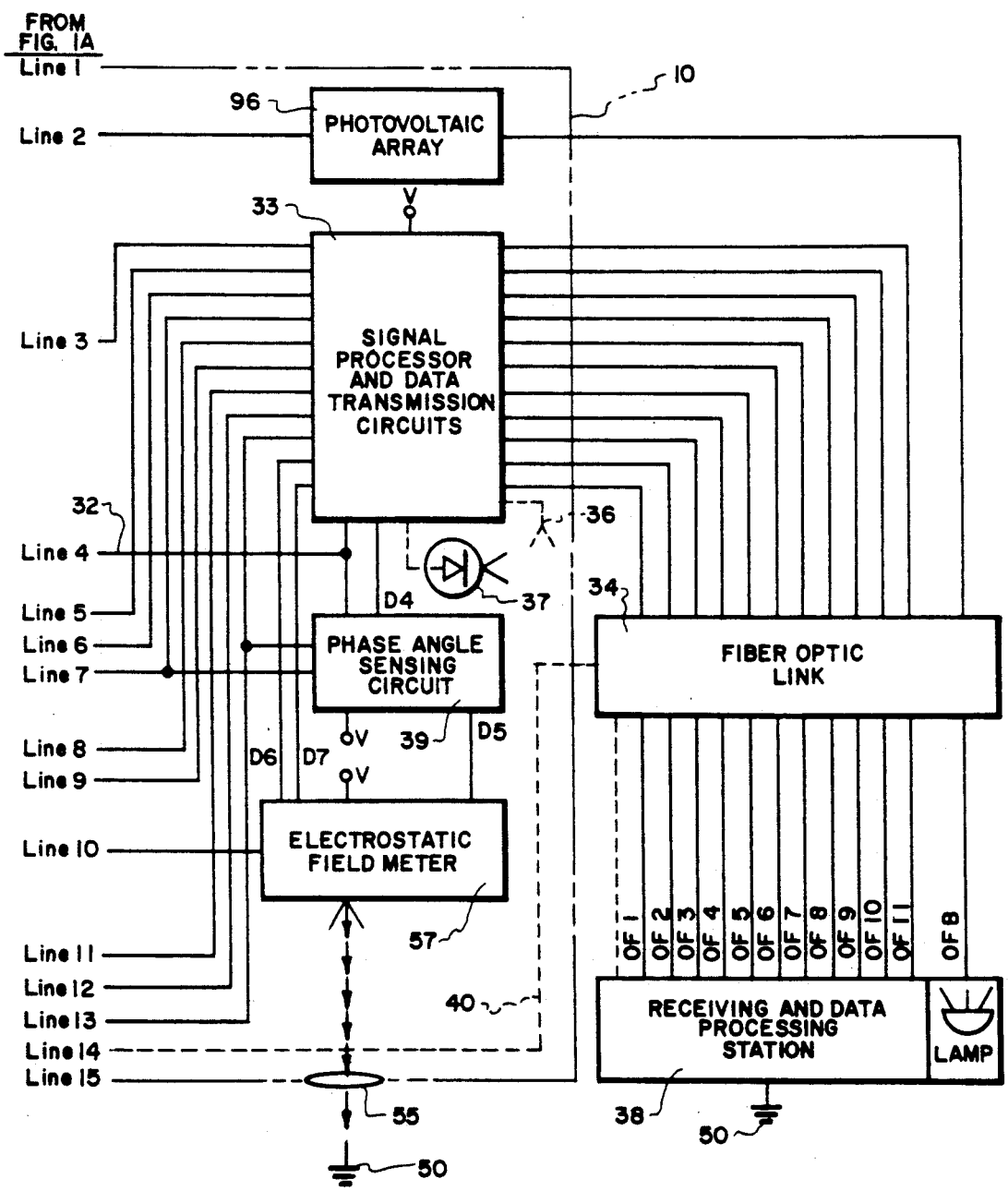

The electrostatic field meter, ESFM, form 57 in FIG. 1B of a type familiar to those knowledgeable in the art, is typically located in the bottom of the line measuring pod 10 with a direct and electromagnetically unshielded view of the earth's ground plane through area 55, which can be considered a view "window" composed of a non-electrically conductive material.

The electrostatic field meter 57, which is connected to the power line system return at 32, measures the electric field gradient from the power line across to the earth as a function of time relative to the earth. This measurement is called the electric field phasor which is the direction and slope of the electric field over time. Note that the measured voltage drop across voltage sensor voltage divider small resistance $R_s$ at 42 is referenced not to earth, but to the power line, via its connection to system return 32. Also, the current through the voltage sensor voltage divider resistive link is phase shifted by the reactance, with the resistive link current leading the line voltage, since the reactance, due to the effect of parallel capacitive and resistive currents near and/or along the length of the voltage sensor voltage divider resistive link, is predominantly capacitive. Thus, for improved accuracy in measuring the phase of the power line voltage, the electrostatic field meter 57 which measures the electric field phasor is the preferred method to measure the line voltage phasor, which herein is called the line electric field phasor. Thus the electrostatic field meter is not used to measure the magnitude of the line electric field or of the line voltage, but rather is used to measure the phasor of the electric field. As a result, in this application, the small errors in the magnitude of the measured electric field which are typical of electrostatic field meters do not significantly degrade the phase accuracy of the measured electric field phasor.

The electrostatic field meter 57 has three outputs, data paths D5, D6, and D7. D5 is the output data path, which data is typically in analog form, over to phase angle sensing circuit 39, which measures the RMS phase angle between the line current phasor (current direction and slope as a function of time) from line current sensing circuit 20 and the line electric field phasor (electric field direction and slope as a function of time) referenced to the earth measured by the electrostatic field meter 57. The output of this RMS phase angle data from phase angle sensing circuit 39, which may be in analog or in digital form, but which is typically in analog form, is sent over via data path D4 to the signal processor and data transmission circuits 33 for A/D conversion, multiplexing, and digital modulation and transmission in bit serial form, along with other RMS data, over optical fiber OF3 to the ground receiving and data processing station 38.

The second analog output of the electrostatic field meter 57 is the analog real time data path D6 directly over to signal processor and data transmission circuits 33 for analog processing modulation and transmission to the ground receiving and data processing station 38 over dedicated optical fiber data path OF6 in FIG. 1. The third output of the electrostatic field meter 57, which may be in analog or in digital form, but which is typically in analog form, is the nearly real time fast digital data path D7 directly over to the signal processor and data transmission circuits 33 for analog processing, A/D conversion, and digital modulation and transmission to the ground receiving and data processing station 38 over dedicated optical fiber data path OF7. These real time analog and nearly real time fast digital electric field waveform phasor data paths D6 and D7, respectively, are fast data paths typically used in power system protection applications for fast protective relaying to quickly open circuit breakers in the event, for example, of a fault on the power line.

The entire measuring station circuitry uses transmission line 12 as its reference potential and circuitry system return. System return 32 is connected to the line at 47 thereby providing a unique form of reference for the measuring station circuitry. There is no current between points 35 and 47; points 35 and 47 are at the same potential. Since the current flows into point 35 from the system return 32, the current according to convention is negative. The current at point 35 is full wave rectified and travels through current sensing circuit resistor $R_C$ to the rectifier at point A. For one-half of each AC cycle the current A travels from A to B to C; during the other half cycle, the current A travels from A to D to E. This method allows the system to take advantage of standard signal processing components by using the power line as the return and a frame of reference.

Fiber optic data link 34, RF data link 36, and optical-through-air data link 37 all transmit data across the voltage gradient between the line measuring station and the ground without causing an electrically conductive path to be established across the voltage gradient. This allows the system to monitor the line and allows the measured parameters to be referenced to line potential, thus allowing the use of circuitry components which effectively do not "see" the high voltage on the line.

Power line 12 current is measured by transforming the current down by a known ratio via current transformer 14. The power line phase conductor serves as the one turn primary winding of the current transformer. Typically, for example, for a 230 KV (line to line potential) power line, if there are 1000 turns in the secondary winding, then the ratio is 1:1000. Thus, if the line is carrying 500 Amperes, the output of the transformer will be 0.5 Amperes. The output of the current transformer 14 is fed to rectifier 16. The transformer current is then determined by direct measurement of the voltage drop across the known precision resistance $R_C$. The current reaching point 35 is negative full wave rectified and flows across $R_C$ to the rectifier at point A. Line current sensing circuit 20 measures the potential drop across $R_C$ via buffer amplifier 29 as shown in FIG. 1A. The measured data is amplified and then delivered to signal processor and data transmission circuits 33. The power supply is shown in FIG. 1A as form 18 and includes a DC/DC converter and regulators. It is protected by an over voltage limiter form 71 such as, but not limited to, a zener diode, or a MOV (metal oxide varistor), which holds the voltage from rising above a set point level due to rising power line current, which may be caused by a fault on the power line, for example.

When under-voltage sensor 61 senses a drop in line voltage, such as when circuit breakers open and interrupt the line, switching and control unit 69 switches over to battery 95 power to power the power supply 18 DC/DC converter and regulators.

Battery 95 may be a primary (non-rechargeable) battery, such as, but not limited to a type of Lithium battery, such as Lithium carbon monofluoride, which is known for long shelf life for periods well over 10 years, and for high reliability in intermittent use (such as in normally off signal activated passive sonar output transmitters) for periods over 10 years, even when exposed to a wide ambient temperature range, such as in outside use in a power company station. Alternatively, battery 95 could be a rechargeable battery, such as but not limited to, nickel cadmium (NiCd) or sealed lead acid. When such a rechargeable battery is used, the power supply 18 would float charge the battery. Rechargeable (non-primary) batteries typically last only 2-5 years given the present state of the art. Further, the battery is only used typically for roughly one second during the transition over to radiant energy unit ground based power from the normal power line power, via current transformer 14. This transition is caused by an outage of the power line, which event may typically occur only two or three times a year. Also, capacitors within power supply 18 are continuously maintained in a charged state to hold power supply DC output voltages steady during said transitions or switch-overs to radiant energy unit ground based power. Thus, in this application, the battery is used typically only 2 or 3 times a year or so for roughly one second or so only to power the line measuring station 10 load of only about 3-5 watts, which is the load for that portion of the line measuring station circuitry, known as hibernation circuitry, which is typically kept operating during a line outage. That circuitry will be described in further detail hereinafter. Lithium primary batteries typically have 3 volts across each cell. Thus 5 cells in series would output 15 volts. Typical Lithium battery life is roughly 1.2 ampere hours. As a result, to supply the line measuring station hibernation circuitry load of about 5 watts, the current output is 5 watts divided by 15 volts equals 0.33 amperes. That current level equates to a life of 1.2 ampere hours divided by 0.33 amperes equals 3.6 hours, or 13,000 seconds, which far exceeds the expected annual usage of roughly less than ten seconds. Thus, primary (non-rechargeable) batteries, such as Lithium, may be the preferred type of battery for this application.

At the same time the switching and control unit 69 switches over to battery 95 power, due to a drop in line voltage, the switching and control unit also turns on the radiant energy unit to provide ground based power since the line may be down in some cases up to one year. The switching and control unit 69 turns off the battery output power, when the radiant energy unit begins operation, which typically occurs within roughly 10. milliseconds.

The turn on of the radiant energy unit starts with a command from switching and control unit 69 over to signal processor and data transmission circuit 33 which transmits over optical fiber OF8 a digital command to the ground receiving and data processing station form 38 to turn on the radiant energy unit ground source. The ground station 38 is powered from ground power, which at a power station might typically be 125 volt DC power from the station battery, which typically is kept charged by the main incoming power to the station.

The radiant energy source may be a laser, or laser diode, or a lamp. Lasers and laser diodes are not preferred due to high cost, low radiant output in watts of power, and short operating life which is typically far below 8,700. hours (1 year of continuous use).

Lamps, however, are inexpensive, powerful, and have long lifetimes. Halogen cycle quartz halogen incandescent tungsten filament commercially available display lamps are particularly well suited for this application. The filament is typically operated at an approximate color temperature of from 2900. to 3100. degrees Kelvin. Such lamps are sold with the lamp cemented with an ellipsoidal all quartz glass reflector with a multiplicity of faceted surfaces to control the beam pattern. This lamp can generate a broad beam, or flood beam, by locating the filament such as to radiate a reflected beam having a second focus roughly several inches in front of the lamp rim reference on the optical axis. Alternatively, by changing the position of the filament, a narrow collimated beam pattern can be projected from the reflector.

These lamps have a typical life of 4000 hours or more, which can be substantially increased up to roughly 10,000 hours or more by operating the lamp at a little less than its rated voltage. For example, a 12 volt lamp can be operated at 11.8 or 11.6 volts, if the attendant loss in watts of output of roughly 20% is acceptable. These lamps typically can have output in the range of 20 or 50 or 75 watts without the need for special cooling apparatus. For additional power in watts, or for additional life in operating hours, additional lamps can be in the source system, given the low unit cost, and small size, 2 inches in diameter by 2 inches along the optical axis, and the fact that there is typically ample ground power available in the power company station to power a multiplicity of lamps.

Figure 6:
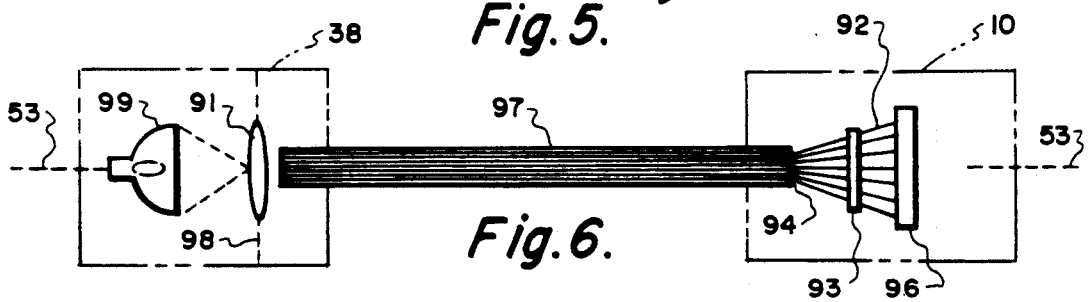
FIG. 6 is a diagram illustrating the radiant energy unit.

In FIG. 6, the quartz halogen reflector broad beam lamps is shown as form 99 within ground receiving and data processing station 38 which provides regulated power to the lamp. The lamp is positioned at a distance from the optical fiber bundle form 97, such that the fibers are located just past the second focus at 98 where the beam is concentrated. Refractive optics (lenses) form 91 can be positioned at 98 on the dotted line optical axis 53, as required to provide additional beam concentration for efficient coupling of the beam into the optical fiber bundle 97.

Optical fiber bundle 97 may be a bundle of glass or plastic fibers, or may be a large single fiber called a cast polymer which is typically an acrylic compound. Each such optical fiber bundle could have a diameter of from 0.1 to 1.0 inches, with diameters of from 0.2 to 0.4 typical. Cast polymer has the advantage that its entire surface area is useful since part of the total surface area of bundles of small fibers may be taken up by the cladding and jacketing of each fiber. Also acrylic cast polymer has a higher operating temperature, roughly 200 degrees C, and less IR propagation losses in dB/kilometers for energy from 700 to 1100. nm (nanometers) than plastic fibers.

Plastic fibers can be assembled into optical fiber bundles and are favorably inexpensive, can operate up to about 100 degrees C., and can easily be polished. However IR propagation losses are roughly 5000. dB/kilometer which is unfavorable even in this application which requires only several meters of length.

Glass fibers can also be assembled into bundles. Although glass costs more, and is more difficult to polish than plastic, it not only has high operating temperatures, but has the lowest propagation losses, particularly in the IR wavelengths, when compared with cast polymers and plastic material. Thus for this application, since the photovoltaic cell array form 96 output amperes per watt for all incident radiant energy wavelengths from about 400-1100. nm, glass, having the favorably lowest radiant energy propagation losses, roughly less than 6. dB/km from 400-1100 nm., may typically be the design choice, despite the fact that the typical length of the optical fiber is short, roughly, in most cases from 1-8 meters, depending on the magnitude of the power line voltage. A glass optical fiber bundle may typically be composed of a multiplicity of small diameter, 25-100 microns, quartz glass fibers each with a cladding of glass or other material having an optical index of refraction less than that of the quartz glass optical fiber, with an outer braiding or jacket of aramid fibers, such as Kevlar, or of Teflon or other fluorocarbon material. The operating temperature of such an optical fiber assembly is favorably high, and may be typically limited by the maximum long term service temperature of the outer braiding which could be about 350 degrees F. for Kevlar aramid fiber, and higher for most fluorocarbons.

Since the lamp 99 reflector is a circular shape, the optical fiber bundle or bundles can have a circular shape at their lamp end, and a circular or square or other shape at the photovoltaic cell array (PVA) form 96 end. The PVA is typically composed of a multiplicity of photovoltaic cells connected in series to add the required voltage output, and also in parallel to add the required current output. Such electrically and mechanically integrated assemblies form a large area which is typically rectangular or square in shape. For example, a typical cell might measure roughly 25. mm by 10. mm in area by 10. mm in height. Silicon cells are typically employed given the current state of the art.

Each photovoltaic cell receives incident radiant energy. Silicon cells output at a fixed voltage a certain current in amperes per watt of incident energy. Silicon cells are sensitive over a range of about 400–1100 nm. with the highest sensitivity in the 750–950 nm. range. The voltage gradient across each cell is typically about 0.4 to 0.6 volts. might be roughly 14. mA per 1.0 cm$^2$ at 0.43 volts, which is a power level of 6.0 mw per 1.0 cm$^2$, from an incident power of 100. mw per 1.0 cm.$^2$, for an efficiency of about 6.0%. Such a standard cell, operating at those relatively low incident and output powers, would usually be cooled by simple thermal convection, or, as required, by the conduction of heat from the cell into a high surface area mechanical heat sink, typically composed of metal material, which thermally conducts the heat from the cell through the body of the heat sink and transfers the heat out to the surrounding air by convection and radiation.

There are several means to couple the light beam from the end of the optical fiber bundle at 94 to the photovoltaic array 96. If the photovoltaic array has a square shape, then the optical fiber bundle can be bundled into a square shape, with its end positioned a distance from the square photovoltaic array, such that the light beam diverging in a square pattern from the optical fiber bundle spreads out over the area of the photovoltaic array. If additional beam spatial concentration or bending is needed, then refractive optics, lenses, can be placed in the beam between the end of the optical fiber bundle at 94 and the photovoltaic array 96.

Alternatively, beam to cell alignment can be achieved by use of an alignment fixture, or jig, form 93 in FIG. 6, typically in the shape of a plate with holes drilled to optically align with the active surface of each cell or group of cells in the photovoltaic array. For example, if the optical fiber bundle had 40 fibers, and the photovoltaic array had 40 cells, then each individual optical fiber could run from the end of the optical fiber bundle at 94 over to the alignment fixture 93 and be connected through each fixture hole to optically align the emitted beam, form 11 so that the beam diverges exactly over, that is, its entire energy is incident over the area of, the target photovoltaic array 96. Such an optical coupling and alignment fixture typically does not require separate refractive optics, and thus avoids the propagation losses associated with optical lenses which can be roughly of the order of 1 to 10 percent. Typically the alignment fixture 93 would have a reflective coating on the side facing the photovoltaic array to reflect any back reflected radiation forward again toward the photovoltaic cell surfaces.

If desirable, to gain an incremental increase in optical propagation efficiency, a reflective dome can enclose the open space through which beam 11 propagates between the termination of the optical fibers on alignment fixture 93 and the photosensitive cell surfaces of photovoltaic array 96. The reflective dome is simply a surface coated with a reflective material such as silver to reflect incident radiation back toward the photosensitive photovoltaic cell surfaces. Form 92 shows the midpoint along optical axis 53 of the reflective dome body. which is typically cylindrical in shape, and whose inner walls are reflective and shaped or curved to reflect incident light back toward the photovoltaic array 96.

Alternatively, a planar transfer method of coupling and aligning the light can be used. The planar transfer body is composed of a material having low optical propagation losses such as glass or quartz etc. Here, if the photovoltaic array is a square 4 inches on a side, for example, a planar transfer body, also size 4×4 inches, could be fed with light by optically coupling optical fibers into each of the 4 edges of the planar transfer body, each edge being roughly 0.1 inches thick. The incoming light will spread out over the interior of the planar transfer body. With the back side and edges of the body coated with an optical film, such as silver, the light then is reflected and projected forward, that is, transferred out of the planar transfer body onto the surface of the photovoltaic array. Such a method typically may not be preferred over the coupling and alignment fixture method due to higher optical propagation losses.

The overall optical efficiency of the FIG. 6 optical system is reasonably efficient for this power line monitoring system application. For example, incandescent convection cooled lamp form 99, with 75 watts of output at 12.0 volts and a life of 4000 hours, operated at 11.5 volts for an extended life of 9000 hours, at that lower voltage outputs 61 watts. With refractive lens 91 used to couple the beam into a 5 meter long glass optical fiber bundle 97 with a 92% efficiency, then 61 watts times 0.92 equals 57 watts transmitted into the glass optical fiber bundle 97. With 99% of the light transmitted into the glass optical fiber bundle reaching the far end of the optical fiber bundle, then 57 watts times 0.99 equals 56 watts of radiant energy projected out of optical fiber and beam alignment fixture 93. With 90% efficiency of coupling the energy into the photovoltaic cell, 56 watts times 0.90 equals about 50 watts absorbed by the photovoltaic array. The photovoltaic array efficiency is, given the present state of the art, about 5 to 15%. With a roughly 5 to 15% efficiency, the absorbed 50 watts of radiant power is converted into from 50 watts times 0.05 equals 2.5 watts, up to watts times 0.15 equals 7.5 watts of electrical power out of the photovoltaic array which is typically sufficient to power the hibernation circuitry which includes the sensors, amplifiers, transmitters, and memory circuitry which is typically maintained in operation when the power line is down (out of service, or interrupted) in system protection applications.

If more power or redundant power is desirable, additional radiant energy unit systems of lamps, optical fiber bundles, and photovoltaic arrays etc. can be employed.

A typical individual silicon cell might measure 1.0×0.4 inches with thus an active total area of 2.5 square cm (cm$^2$), and output 35. mA (milleamperes) at 0.43 volts, or 15 mw/2.5 cm$^2$ for an average output of 6. mw/cm$^2$, from 100. mw/cm$^2$ of incident power, for an efficiency of 6/100=6%.

For example, roughly 2 watts of power may be needed to run the current sensor, along with the real time analog current waveform transmitter, and the current analog to digital converter and the fast digital current waveform transmitter, plus memory. As for photovoltaic cell array area required, at a rate of 6. mw/cm$^2$ of output, 2 watts would require 2.0/.006 equals 333. cm$^2$, or 51. square inches, which equates to roughly 3 each photovoltaic arrays each at 4×4 inches square. If 4 watts were needed, then 4.0/0.006. cm², or 103. square inches, which area could be formed from 4 each square panels each about 5 inches on a side. As for required power, if the cell conversion efficiency is 6%, and 2 watts of output are needed, then 2 times 100/6, or 33 watts of incident power must be absorbed by the cell array.

Within the line measuring station 10, all circuit boards may be enclosed within a shielded box in the shape of a cube having a 5 inch side. In such a case a 5 inch square photovoltaic array could be attached to the outside surfaces of up to 5 of the sides with the 6th side dedicated to mechanical and circuitry connections.

Alternatively, several or all of the photovoltaic arrays can be arranged in a stack employing the planar transfer body device described above. Since a 4×4 photovoltaic array is only about ½ inch deep, a 4×4 inch planar transfer device could be positioned directly over the photovoltaic array, thereby adding roughly only 0.2 inches to the height of the unit. Thus each photovoltaic array/planar transfer composite unit would be only about ¾ inch high and have a volume of 4×4×0.75=12 cubic inches. Such a favorable space savings may offset any significant optical losses within the planar transfer device.

Normal power from the rectifier 16 at F, which rectifier is powered by the power line, is fed through switching and control unit 69 to the power supply 18 which contains the DC/DC converter and regulator circuitry, which typically outputs +5, +15, and −15 DC volts.

When the power line is interrupted, and the resultant drop in line voltage is sensed by the under voltage sensor 61, that data is sent not only to switching and control unit 69 for the turn on of the battery during the transition over to radiant energy from the ground, but also that low line voltage sensed data is sent over to the power distribution control hibernation switch circuit 59, which is normally closed, causing the hibernation switch circuit to open. Circuitry power paths P4, P5, and P6 are disconnected when hibernation switch circuit 59 opens. Typically those power paths were powering sensors, amplifiers and transmitter circuitry for temperature, RMS current and voltage, and other data not needed to be measured during a line outage. However, necessary system protection circuitry, also known as hibernation circuitry, is not interrupted. Thus power paths P1, P2, and P3 are kept open and alive to perform the instantaneous current, voltage, and electric field phasor measurements, plus the maintenance of control circuitry memory, without interruption during the line outages, for up to one year as a typical design objective in a system protection application.

If the line measuring station 10 is not used for system protection, the station may not need to operate in any mode during a line outage, thus several components may not be needed, and therefore not be part of the station in such applications, including: the under voltage sensor 61, the switching and control unit 69, the power distribution control hibernation switch circuit 59, the battery 95, and the radiant energy unit comprising photovoltaic array 96, optical fiber bundle (OFB in FIG. 1, form 97 in FIG. 2), and lamp radiant energy source (form 86 in FIG. 1, form 99 in FIG. 6).

When the monitoring system is located on a direct current (DC) high voltage transmission line, power may be supplied by the ground based radiant energy unit located within the receiving and data processing station 38, or by battery, fuel cell or solar cell devices. When the monitoring system is mounted on an AC high voltage transmission line typically a current transformer 14 can be used to inductively draw power from the conductor to power the system. However, on a DC transmission line, a current transformer will not work since the magnetic field from the DC line does not vary with time.

Thus, the monitoring system measuring station power source is typically different for AC and DC power lines. Also, phase angle measurement and power factor calculation as described herein are applicable to AC and not to DC power lines. However, for both AC and DC power lines the voltage and temperature sensors, data links and other system components are the same, except that the current sensing circuit for AC lines is as described herein, whereas the current sensing circuit for DC lines would be different in that it might employ the well known Hall effect current sensing means.

Line voltage sensing circuit 30 uses a voltage divider concept connected to the system return line 32 providing a derived voltage measurement output to signal processor and data transmission circuits 33. Line voltage sensing circuit 30 has a resistive link physical bridge 83 connected at one end to circuitry system return line 32 with the other end connected to earth ground 41. The voltage divider is comprised of one or more, but typically one, small precision resistance $R_s$ connected to the return line 32 at one end in series with a large resistance $R_L$. $R_L$ is connected to $R_s$ at one end and to a ground based earth ground potential terminus at the other end. This terminus is shown in FIG. 1 as 41 for the case where the resistive link cable assembly forms its own bridge to ground, and as 50 in FIG. 1 for the case where the resistive link is a component of a fiber optic cable assembly 34. The mechanical link between line voltage sensing circuit 30 and the fiber optic data transmission link 34 is indicated by dotted line 40 which will be described in greater detail hereinafter.

The voltage sensor voltage divider resistive link 83, which is composed of resistances $R_s$ and $R_L$, is shielded by a twin resistance outer shield resistive link 81. Twin resistance means that the resistance of $R_s$ equals that of $R_{ss}$, and the resistance of $R_L$ equals that of $R_{Ls}$, where $R_{ss}$ is the small outer shield resistive link resistance, and $R_{Ls}$ is the large outer shield resistive link resistance. The outer shield resistive link 81 has vertically spaced electrically conductive shield rings 82, which in FIG. 1 are indicated only by dotted lines, and which are shown in detail in FIG. 2. Shield rings 82 enclose the voltage sensor resistive link 83, and thereby reduce the effect of stray capacitance capacitive currents which are driven by the voltage gradient between the resistive link 83 current and the ground. The stray capacitance electrically couples across the voltage gradient between the high voltage resistive link current and a sizable area of the ground plane of the earth's surface surrounding the ground terminus of the resistive link.

Capacitance in units of farads is defined as Coulombs of electric charge per unit change in voltage, in units of volts, The relevant form $$\Delta V = \Delta Q / C \qquad \text{Eq. 1}$$

where $\Delta V$ is the voltage gradient between some point n along the divider at an elevation above the ground h, and the ground plane ground potential in volts, and $\Delta Q$ is the stray capacitance current charge at n in Coulombs, and C is the stray capacitance at n in farads.

Stray capacitance is a distributed capacitance between every point along the voltage sensor voltage divider resistive link 83 and the ground plane. Stray capacitance C is a function of the electric permittivity of the medium $\epsilon$ (Epsilon), where for a medium of free space $\epsilon = \epsilon_0 = 8.85$ picofarads per meter, of the length, 1, of the divider in meters, and of radius of the divider, r, in meters. The IEEE provides an equation for stray capacitance in its publication ANSI/IEEE Std. 4-1978, Appendix 4A:

$$C = 2\pi \epsilon l G \text{ where } G = 1/\ln(l/r \sqrt{3}) \qquad \text{Eq. 2}$$

Thus C in Eq. 2 is a function of $\epsilon$, l, and $1/\ln$, where $\epsilon$ is farads of capacitance per meter, where said farads of capacitance, C, is a function of $\Delta V$ and of $\Delta Q$ by Eq. 1 above.

This capacitive coupling forms a quasi parallel or quasi shunt, complex of voltage sensor voltage divider circuit current conduction pathways transporting charge $\Delta Q$ in Eq. 1 from the voltage sensor voltage divider resistive link across the line to ground voltage $\Delta V$ in Eq 1. Quasi parallel or quasi shunt current conduction pathways mean that the capacitive paths to ground physically terminate over a sizable area of the earth's ground plane surrounding the singular physical ground terminus of the resistive link. These pathways form an aggregate capacitive reactance voltage divider impedance component, $X_c$, where:

$$X_c = 1/wC \text{ where } w = 2\pi f \qquad \text{Eq. 3}$$

Frequency f, is typically 60 Hz or 50 Hz. In a high voltage application, this capacitive reactance impedance in ohms can be less than that of the large ohmic resistance of the voltage sensor resistive link 83 in ohms. Thus, a significant portion of the resistive link current can be lost when the resistive link is used on high voltage power company transmission lines.

In summary, the stray capacitance current lost is a function of the $X_c$ impedance, which is a function of frequency, w, and of capacitance, C, where C is principally a function of the electric permittivity of the medium $\epsilon$ by Eq. 2. Thus, by Eq. 1, the $\Delta Q$ stray capacitance current charge is a function of $\Delta V$ and of C, where $\Delta V$ is the voltage gradient between the voltage sensor resistive link 83 and the ground.

Of all those variables, said voltage sensor voltage divider unique design favorably minimizes the variable $\Delta V$, the voltage gradient "seen" by the voltage sensor voltage divider resistive link, and thus favorably reduces the stray capacitance current lost from the resistive link. That favorable result is accomplished by a twin resistance outer shield resistive link 81, to which is attached a closely spaced series of outer shield rings 82, which generate a near zero voltage gradient in the horizontal plane surrounding each incremental linear segment along the vertical length of the resistive link 83 from the overhead power transmission line down to the ground.

Thus, the ring shields 82 of the outer shield resistive link 81 create an equipotential, or isovoltaic horizontal plane within the ring shields 82 which enclose the voltage sensor voltage divider resistive link 83. This means there is a near zero voltage gradient between the voltage sensor resistive link 83 and the outer shield resistive link 81 shield rings 82. Thus, by the above Eq. 1, by using the outer shield resistive link 81 with its outer rings 82 enclosing the inner voltage sensor voltage divider resistive link 83, the $\Delta V$ voltage gradient horizontally between the inner resistive link 83 and the shield rings 82 of outer shield resistive link 81 is nearly zero, and thus there is a favorable reduction in the magnitude of the $\Delta Q$ stray capacitance current charge lost out of voltage sensor voltage divider 83, in comparison with the magnitude of the $\Delta Q$ stray capacitance current charge lost if the outer shield rings 82 of outer shield resistive link 81 were not present.

This favorable shielding effect is limited since the outer shield rings 82, although fully enclosing the inner voltage sensor resistive link 83 in the horizontal plane, are spaced at intervals vertically along the length of the resistive link from the power line down to the ground, and are encapsulated within an electrically insulating mastic material 65 in FIG. 4, and thus do not form a continuous electrically conductive vertical shield.

Thus, since the outer shield resistive link 81 ring shields 82 do not completely enclose the inner resistive link 83 of the voltage sensor, some small stray capacitance current charge $\Delta Q$ will be lost from the resistive link 83 current.

In the sense of a classical voltage divider, by Ohm's Law, the ratio of the voltage $V_s$ across the small resistance arm $R_s$, of voltage sensor voltage divider resistive link 83, is proportional to the voltage $V_L$ across the large resistance arm $R_L$, since the current is conserved. That is, the current across the small resistance arm $I_s$ equals the current across the large resistance arm $I_{sG}$. But when there is a large voltage gradient across the divider, such as the voltage gradient between a power transmission line and ground, current is not conserved, since some current is lost to the stray capacitance currents to ground. Thus the ratio of $V_s$ to $V_L$ is not simply equal to the ratio of $R_s$ to $R_L$. Rather: $V_s/V_L = (I_s/I_{sG})(R_s R_L)$.

Thus, the total voltage drop across the entire divider which is the power line voltage, $V_T = V_s + V_L = V_s + (V_s)(I_{sG}I_s)(R_L R_s)$.

Besides stray capacitance, there can be transient capacitive and resistive currents both radially and vertically in the air outside the fiber optic cable assembly, or on the surface of the fiber optic cable assembly. Such currents change with time from zero to non-zero values as a result of physical changes on or near the fiber optic cable assembly such as liquid water, humidity (water vapor), temperature, dirt, electrostatic charge, etc. These currents do to a certain extent, capacitively couple to the voltage sensor voltage divider resistive link 83 current. The capacitive reactance impedance in ohms associated with this capacitive coupling between the resistive link 83 current and these transient currents is usually greater than the impedance of the resistive link 83, and thus the resulting loss of current from the resistive link 83 is small. Thus, like the result of stray capacitance on the current through resistive link 83, the net and relevant result of this capacitive coupling between the resistive link 83 current and nearby transient capacitive and resistive currents is the loss of voltage sensor voltage divider current.

Thus, because of the effect of stray capacitance, and of transient resistive and capacitive currents, on a voltage sensor voltage divider bridging across a high voltage gradient from a high voltage power line to an earth ground terminus, the current ratio factor ($I_{sG}/I_s$) is always less than one. Thus, voltage readings which are not corrected for this effect will be too high. For example, if 5% of the current is lost, then the voltage measurement would be 5% too high. To correct this, the voltage drop $V_s$ across $R_s$, a known precision resistance, is measured at 42 by buffer amplifier 44, and also the voltage drop $V_{sG}$ across $R_{sG}$ is measured at 84 by buffer amplifier 80. $R_{sG}$ is a known precision resistance equal to $R_s$ and is located between points 88 and 84 on the ground end of the resistive link 83, which extends from 45 across to 41 in FIG. 1, and from 45 across to 50 in FIG. 2. $R_{sG}$ and buffer amplifier 80 shown in FIG. 1A and in FIG. 2 are located at the ground terminus of the resistive link 83, which typically is within the $R_s$ and $R_{sG}$ are the same, by Ohm's Law, the ratio of $V_{sG}$ divided by $V_s$ is equal to the ratio of the resistive link 83 current $I_{sG}$ at 84 divided by the current $I_s$ at 42. Thus the above equation for $V_T$:

$$V_T = V_s + V_L = V_s + V_s(I_{sG}/I_s)(R_L/R_s)$$

becomes $$V_T = V_s + V_s(V_{sG}/V_s)(R_L/R_s).$$

This ratio of $V_{sG}$ divided by $V_s$, or is called the voltage sensor voltage divider measurement correction factor. Thus taking the measured voltage $V_s$, and adding the product of the measured voltage $V_s$ times the correction factor times the known ratio of $R_L/R_s$ yields a voltage measurement corrected for the loss of current across the voltage divider resistive link 83. For example, if the uncorrected measured voltage $V_s$ is 1 volt, and the known ratio of $R_L/R_s$ is 999/1, and the correction factor of $V_{sG}/V_s$ equals 0.95/1.00 which equals 0.95, then the corrected voltage measurement is the sum $V_s$ plus the product $V_s$ times $V_{sG}/V_s$ times $R_L/R_s$ which equals: 1 volt plus 1 volt times 0.95 times 999 = 950. volts. This correction factor is typically processed by ground station 38 for all the voltage sensing circuit 30 data outputs. Since the $V_s$ term can cancel out of the second term on the right side of the above equation, the implication is that a single small resistance $R_s$ can be located within the ground station 38 thus deleting the $R_{sG}$ resistance and the correction factor processing. That configuration is typically not preferable because of measurement inaccuracies, since the resistive link capacitive current losses, whose steady state and transient components change over time, are unknown, not measured, and thus said changes are not corrected for.

Voltage sensing circuit 30, in FIGS. 1A and 2, has a small precision resistance $R_s$ connected at 45 to circuitry system return 32 in contact with transmission line 12 at 47 in FIG. 1A. Small resistance $R_s$ in series with precision large resistance $R_L$ forms a precision ratio voltage divider for measuring voltage on transmission line 12. The effect of stray capacitance on the voltage sensor voltage divider composed of the resistive link 83 containing $R_s$ and $R_L$ is reduced by a twin resistance parallel outer resistive link 81 having shield rings 82 spaced at close intervals, roughly one ring every 0.1 to 1.0 inches, along the long axis of the outer shield resistive link 81 which shield rings surround the voltage sensor voltage divider large resistance resistive link 83, as shown in FIG. 2, and in FIG. 1A within phantom lines 79. The ring shields 82, being composed of material which is an electrical conductor, and which typically can be formed of silver coated copper wire roughly 0.010–0.10 inches in diameter, are electrically and mechanically fastened to the outer shield resistive link 81 via soldering, for the case of the discrete resistor assembly, or via a simple electrically conductive metallic compression clamp for the case of the homogeneous polymeric filamentary large resistance. The entire outer shield resistive link 81 and its shield rings 82, along with the voltage sensor divider resistive link 83, are potted and encapsulated within a solid matrix of electrically insulating mastic material 65 in FIG. 4, as will be described in greater detail hereinafter.

Preferably large resistances $R_L$ and $R_{Ls}$ are high resistance elements incorporated into a fiber optic cable assembly 34 in FIG. 1B and 48 in FIG. 2 thus providing an advantageous low cost unibody mechanical construction which is connected to earth ground at 50.

Large resistances $R_L$ and $R_{Ls}$ can be formed of homogeneous materials such as polymeric or ceramic materials containing a sufficient concentration of electrically conductive material to allow a small current to flow through the voltage gradient from the power line 12 to the earth ground 50, or by a discrete resistor assembly constructed of a plurality of discrete resistors having high precision tolerance and low temperature coefficient of resistance (TCR) Megohm resistances in series whose typically axial leads are connected end to end.

The resistive material forming $R_L$ and $R_{Ls}$ in cable 48 of FIG. 2, and in cable 54 or in cable 63 of FIG. 3, runs along the length of the cable between the monitoring system measuring station and a ground receiving and data processing station which may be located down on the ground, or up in the power transmission line tower. Large resistors $R_L$ and $R_{Ls}$ will be encased in a high voltage insulating dielectric intermediate jacket 66 in FIG. 4, with typically disc shaped sheds 60 in FIG. 3 formed over the outer waterproof jacket 68 in FIG. 4 to increase the creepage (high voltage discharge or arc-over) distance, thus forming a cable assembly suitable for exposure to weather, protection from corona damage and for outdoor use at elevated voltages.

The magnitude of the total resistance of the voltage dividers formed by $R_s$ and $R_L$, and by $R_{ss}$ and $R_{Ls}$, is determined to allow a controlled small current flow of about 0.1 milleamperes (mA) to flow through voltage sensor voltage divider resistive link 83 and outer shield resistive link 81, thereby preventing any excessive dissipation of heat within the resistive links 81 and 83 and minimizing any potential electric shock hazard to service personnel. Small resistances $R_s$ and $R_{sG}$ should be small enough to be a high precision tolerance and low TCR resistor components of the line voltage measuring system, but sufficiently large to cause a measurable potential drop at 42 and 84, respectively.

Figure 5:
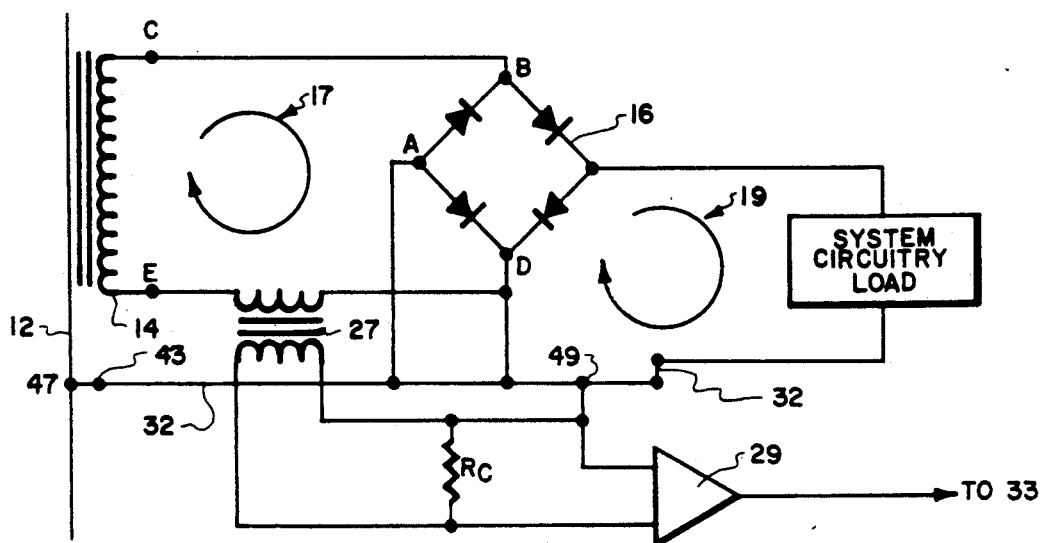
FIG. 5 is a diagram semi-schematic form illustrating an alternative current sensor configuration from that described in FIG. 1.

An alternative way to measure current as shown in FIG. 5 is to put a small current transformer 27 in series with the secondary of the main current transformer 14 at point 31 in FIG. 1. In this arrangement, the secondary of the small current transformer 27 is isolated from the rectifier 16 and is connected to the system return 32 at 49 and is terminated in a current sensing resistor $R_C$ followed by a buffer amplifier 29. There is no current at point 43. In FIG. 5, and likewise for the corresponding current loops in FIG. 1 since power line is AC, current loop 17 is AC, and rectifier 16 makes current loop 19 DC.

Temperature sensors 22 and 28 are in contact with the transmission line 12 at 24 and with ambient air respectively. These temperature sensors are preferably current sources since the power line's strong electromagnetic fields tend to interfere with temperature sensors such as thermocouples whose output typically is in units of millivolts (mV) per degree of temperature change. Thus, the signal derived from the temperature sensors is a change in current per degree (Fahrenheit or Kelvin) which is amplified by temperature sensing amplifier circuits 26 and then delivered to the signal processing and data transmission circuits 33.

Signal processor and data transmission circuits 33 receive a multiplicity, 12 are shown in FIG. 1, of analog measurement data inputs in analog (linear) form from line voltage sensing circuit 30, line current sensing circuit 20, temperature sensing circuits 26, electrostatic field meter 57, and phase angle sensing circuit 39.

The three analog inputs from the line voltage sensing circuit 30 are the real time analog voltage waveform, via data path D1A, the nearly real time fast digital voltage waveform via data path D1D, and the RMS voltage measurement data via data path D2. The three analog inputs from the line current sensing circuit 20 are the real time analog current waveform via data path D1A, the nearly real time fast digital current waveform via data path D1D, and the RMS current measurement data via data path D2. The two analog inputs from the line temperature circuits 26 are the line temperature measurement data via data path D3X, and the ambient temperature measurement data via data path D3Y. The two analog inputs from the electrostatic field meter 57 are the real time analog electric field phasor waveform via data path D6, and the nearly real time fast digital electric field phasor waveform via data path D7. These real time analog and fast digital electric field waveforms are typically used to measure the instantaneous values of the phase angle in system protection applications. These instantaneous values of the phase angle are typically processed by processor circuitry within the receiving and data processing station 38.

The two analog inputs to signal processor and data transmission circuits 33 from the RMS phase angle sensing circuit 39 are the RMS phase angle via data path D4, which compares the current and the electric field phasors, and the RMS phase angle via data path D8, which compares the current and the voltage phasors. Said RMS phase angle data via data path D8, which is a comparison of the current and the voltage phasors, is typically less accurate than the data path D4 data, which is a comparison of the current and the electric field phasors, and thus is not used typically for measurement purposes, but is included for purposes of engineering analysis of the differences if any between the two comparisons, and for redundancy.

The three analog phasor inputs into RMS phase angle sensing circuit 39 are: for current, data path D2 from line current sensing circuit 20; for electric field, data path D5 from electrostatic field meter 57; and for voltage, data path D2 from line voltage sensing circuit 30.

In addition to analog measurement data inputs to signal processor and data transmission circuits 33, there are also control data inputs to and outputs from signal processor and data transmission circuits 33 for purposes of controlling the radiant energy unit and for general system diagnostics and/or calibrations. The only control data path input shown is control data path C1 from the power switching and control unit 69 to turn on and to turn off the radiant energy unit whose ground based radiant energy source is shown as lamp 86 in FIG. 1B.

Typically, true RMS voltage and true RMS current and RMS phase angle analog data for metering or load management purposes are input to the signal processor and data transmission circuits 33 for digitizing and transmission over the fiber optic 34, or optical 37, or radio 36 data link to the ground receiving and data processing station 38.

Typically, a measure sample, for example, of the true RMS voltage value, requires roughly 25 microseconds ($\mu$s) to convert from analog form to digital form. Typically, the digital measure sample can have 8, 10, or 12 bits. Typically, the digital measure sample is latched, and then loaded in parallel into a shift register which shifts the multi-bit measure sample serially to the digital transmitter. The digital transmitter may require, given today's state of the art, roughly 8 to 16 microseconds to transmit a single 10 bit measure sample. Also, there is typically an 8 to 16 microsecond orientation interval between the transmission of the last measure sample and the transmission of the next measure sample. Thus, in this example of a digital data link transmitting a single measure sample, a new measure sample is transmitted every 16 to 32 microseconds. Thus, the data transmission cycle period is 16 to 32 microseconds.

Measure samples of other parameters, such as true RMS current, can be added. Each additional measure sample, in our example, would typically add roughly 16 to 32 microseconds to the data transmission cycle period.

For purposes of system protection or protective relaying or waveform or harmonics analysis, the real time analog and fast digital waveforms of voltage and current, and the real time analog and fast digital electric field waveforms are each transmitted over a dedicated optical fiber which fiber is connected at its line end to a dedicated analog transmitter for the real time analog data, and to a dedicated digital transmitter for the fast digital data. These transmitters are part of signal processor and data transmission circuits 33. The dedicated optical fibers are connected at their ground end to a dedicated analog receiver for the real time analog data, and, to a dedicated digital receiver for the fast digital data. These receivers are part of the ground receiving and data processing station 38.

The system installation is illustrated in FIG. 3. All the system circuitry within the housing pod 10 indicated by phantom lines in FIG. 1 will be housed within a smoothly contoured spherical or semi-spherical or box-shaped housing or pod 52 mounted or clamped on transmission line 12 with a device known as a "hot-stick" used by power companies. This method allows the system to be installed on power transmission lines without interruption of the flow of power. Large resistance $R_L$ and $R_{LS}$ of the resistive links 83 and 81 are typically contained within a cable assembly 54 connected from housing 52 to power line tower 56 at 58, or to another terminus on the ground, such as within a power company transmission station or sub-station. Cable 54 has sheds 60 which are used to make creepage distance along the cable greater than the actual cable length. Transmission line 12 is connected to tower 56 by conventional rigid insulator bushing 62 and is interconnected to a continuing transmission line on the other side of the tower by connecting link 64.

Preferably the data communications link from the monitoring system line measuring station is a fiber optic cable data link rather than a radio or optical-through-air data link. The radio type of data transmission is typically used where the transmission line monitoring system is located a long distance from the ground receiving and data processing station. The ground based receiving and data processing station 38 (FIG. 1) requires ground electrical power to be available; and, is co-located with downstream revenue metering, protection, load management/networking, cogeneration, or other equipment using the measured data, or is co-located with downstream telemetry equipment which in turn transmits the measured data on to downstream equipment. Where there is nearby ground electric power available, the ground receiving and data processing station 38 (FIG. 1) can be in communication with the monitoring system by a fiber optic cable. In this preferred embodiment the fiber optic cable and the long linear filamentary shaped body of the $R_L$ and $R_{Ls}$ resistances will be combined into a single cable assembly 54 serving as both a data link and as a voltage sensor resistive link.

Figure 7:
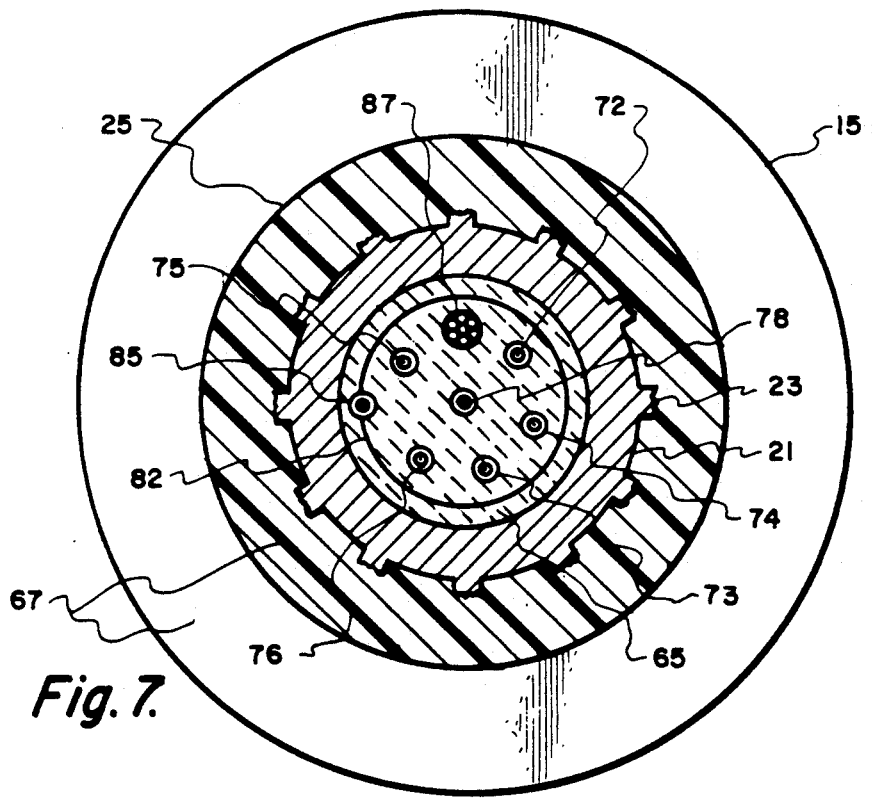
FIG. 7 is a cross-sectional view of a rigid fiber optic housing assembly incorporating data and radiant energy optical fibers, voltage sensor voltage divider resistive link and outer shield resistive link, and a rigid outer support body made of electrically insulating material and having sheds.

Preferably fiber optic cable assembly 54 contains, besides the voltage sensor resistive link 83 and shield resistive link 81 with shield rings 82, components such as optical fibers, a flexible or rigid dielectric strength member, and intermediate and outer jackets providing dielectric insulation, waterproofing and ultraviolet radiation resistance. These components are shown in FIGS. 3, 4, and 7 and are described in detail hereinafter.

The dielectric strength member is composed of an electrically insulating material which can be chosen not only for its mechanical strength, but also for flexibility, which is an advantage of fiberglass, or for rigidity, which is a property of glass and of ceramic materials such as porcelain. In applications where the fiber optic cable assembly not only drops down vertically from the overhead power line, but also bridges a horizontal distance over to its ground terminus, such a bending requirement favors the use of a flexible fiber optic cable assembly employing a flexible dielectric strength member. Such an assembly is called, herein, a flexible fiber optic cable assembly, or simply, a fiber optic cable assembly. Whereas, if the fiber optic cable assembly is employed in a straight vertical upright orientation, the strength of a rigid dielectric strength member may be advantageous. Such a rigid fiber optic cable assembly is called herein a rigid fiber optic bushing assembly.

A preferred arrangement for the construction of the flexible fiber optic cable assembly 54 is illustrated in FIG. 4. Typically, the dielectric strength member 70 is positioned at the center of the cross sectional area of the cable and is used to reinforce the cable and to carry the tensile and any torsional loads. Mastic material 65 forms a matrix between dielectric strength member 70 and the dielectric shield intermediate jacket 66, within which mastic material the desired number of optical fibers (4 are shown: 72, 74, 75, and 76), the radiant energy unit optical fiber bundle 87, and, if the resistive link is not separate from the fiber optic cable assembly, the voltage sensing circuit voltage divider resistive link large resistance $R_L$ form 78, and the twin resistance outer shield resistive link large resistance 85 with shield rings 82, are all encapsulated. Environmental resistive outerjacket 68 encloses the dielectric shield intermediate jacket 66. In the cross sectional FIG. 4 view of cable assembly 54 the voltage sensor voltage divider resistive link large resistance $R_L$ form 78, and its twin resistance outer shield resistive link large resistance $R_{Ls}$ form 85 are shown as a continuous linear filamentary form. In FIG. 2, outer shield resistive link 81 shield rings 82 are shown as circular rings enclosing voltage sensor voltage divider resistive link 83 which includes small resistance $R_s$ and large resistance $R_L$. In FIG. 4 $R_L$ is shown as form 78, $R_{Ls}$ as form 85, and the outer shield rings as form 82.

Optical fibers 72, 74, 75, and 76 in FIG. 4 can be considered as optical fiber data paths OF1, OF4, OF2, and OF5 in FIG. 1. OF1 and OF4, respectively, represent the optical fiber data paths for the real time analog voltage waveform data path D1A from line voltage sensing circuit 30, and for the nearly real time fast digital voltage waveform data path D1D from line voltage sensing circuit 30.

Data paths OF2 and OF5, respectively, represent the optical fiber data paths for the real time analog current waveform from data path D1A from line current sensing circuit 20, and the nearly real time fast digital current data path D1D from line current sensing circuit 20. Analog data paths D1A from line voltage sensing circuit 30 and D1A from line current sensing circuit 20 are linearly modulated and transmitted in linear form through the linear data links OF1 and OF2, respectively. Digital data paths D1D from line voltage sensing circuit 30, and D1D from line current sensing circuit 20 are digitally modulated and transmitted in digital form through the digital data links OF4 and OF5, respectively.

OF3 in FIG. 1 represents the optical fiber data path for the line true RMS current and true RMS voltage, line RMS phase angle, line and ambient temperature data digitally modulated and serially transmitted in digital form from the signal processor and data transmission circuits 33 through the digital data link OF3 to the ground receiving and data processing station 38. The line RMS phase angle data comprises both the phase angle data based on the comparison of current and electric field phasors from data path D4, and also the phase angle data based on the comparison of current and voltage phasors from data path D8. Data paths D4 and D8 are output data paths from phase angle sensing circuit 39 into signal processor and data transmission circuits 33.

Data paths OF6 and OF7, respectively, represent the optical fiber data paths for the real time analog electric field waveform phasor from data path D6, and the nearly real time fast digital electric field waveform phasor from data path D7, both data paths from electrostatic field meter 57 over to signal processor and data transmission circuits 33 for analog (D6 data) and digital (D7 data) measurement data processing modulation and transmission. This instantaneous electric field data is typically used in system protection applications to measure the instantaneous phase angle by comparison of the instantaneous current and electric field phasors.

Data paths OF8 and OF9, respectively, represent the optical fiber data paths for the control commands from the line measuring station 10 down to the ground receiving and data processing station 38 to turn on, via data path OF8, or to turn off, via data path OF9, the radiant energy unit, whose ground source is shown as lamp form 86 in FIG. 1. These turn on and turn off commands are sent from switching and control unit 69 via control data path C1, which is typically an analog data path, but could alternatively be a digital data path, over to signal processor and data transmission circuits 33 for data processing, modulation, and transmission through the fiber optic cable assembly down to the ground receiving and data processing station 38, which contains the circuitry controlling the operation of the radiant energy unit ground source which is also contained within ground station 38.

Digital optical data paths OF10 and OF11 between signal processor and data transmission circuits 33 and the ground receiving and data processing station 38 enables 2 way, or duplex, communication between the ground and the line measuring station pod 10 on the high voltage power line without taking the station out of service for purposes of in field diagnostics and calibration.

Typically the optical fibers shown in FIG. 4 as forms 72, 74, 75, and 76 are helically or spirally wrapped around the flexible central dielectric strength member 70 with a pitch of about one turn per linear foot along the entire length to avoid any tensile loading on the optical fibers.

Four optical fibers are shown in FIG. 4 for simplicity. However more optical fiber bundles which are shown as optical path OFB in FIG. 1, as form 87 in FIG. 4, and as form 97 in FIG. 6, 11 each dedicated optical fibers for data: OF1 (analog voltage), OF2 (analog current), OF3 (multiplexed values of RMS current and RMS voltage, RMS phase angle, and line and ambient temperatures), OF4 (fast digital voltage), OF5 (fast digital current), OF6 (analog electric field phasor), OF7 (fast digital electric field phasor), OF8 and OF9 (command data paths to turn on via OF8, or to turn off via OF9, the radiant energy unit ground radiant energy source), OF10 and OF11 (digital diagnostics and calibration control data path ground to line, OF10, and from line to ground, OF11).

The large resistance $R_L$ of the voltage sensor resistive link 83 shown in FIG. 4 as form 78, and the large resistance $R_{Ls}$ of the twin resistance outer shield resistive link 81 shown in FIG. 4 as form 85 may run straight down a groove or through a hole or be encapsulated within either mastic matrix 65 or flexible central dielectric strength member 70 or intermediate jacket 66 of the cable assembly 54 in FIG. 3. Alternatively, the large resistances 78 and 85 may wrap helically or spirally around the flexible central strength member 70 or the mastic matrix 65 along with and having the same pitch as the optical fibers in order to avoid any tensile loading on the optical fibers or on the resistive link. Any resistive link inductive effects due to this large pitch typically are acceptably small; however, if it is desired to cancel out any inductive effects, then the voltage sensor voltage divider resistive link large resistance $R_L$ form 78 could alternately consist of two separate identical resistive link large resistance filaments wrapped in a counter-helical fashion so that the induction of one is canceled by the equal magnitude induction in the opposite direction from the other resistive link large resistance filament.

Optical fibers 72, 74, 75, and 76 may be plastic, but are preferably glass fibers of pure silicate cladded with a suitable reflective and a result of physical changes on or near the fiber optic cable refractive material to a diameter about twice that of the glass fiber itself and also having a protective coating around the cladding. For the purposes of favorable endurance to long term mechanical stresses and dynamic loading it is preferred that the optical fibers are helically wrapped around a central dielectric strength member 70. As stated previously, a pitch of about one turn per linear foot of the flexible central dielectric strength member 70 would be suitable. Optical fibers 72, 74, 75, and 76 will be embedded within the visco-elastic mastic material 65, which also surrounds voltage sensor resistive link large resistance $R_L$ shown as 78, and the outer shield resistive link large resistance $R_{Ls}$ shown as 85, and flexible dielectric strength member 70, and bonds to intermediate jacket 66.

Since this system is subject to a high voltage environment, dielectric shield intermediate jacket 66 is needed to electrically insulate the core to prevent any current discharges across the cable radially from any radial voltage gradients between the core and the surrounding air. Since outer jacket 68 is exposed to outdoor ambient air and weather, it is optimized to be waterproof and resistant to oxidation and degradation from ultraviolet exposure; thus, for example, heat shrinkable polymers or co-polymers or silicon rubber or polyethylene would be most desirable. The cable assembly 54 components shown in FIG. 4 which are contained within the dielectric shield intermediate jacket 66 are referred to collectively as the core of the cable assembly.

Such compositions are particularly useful in terms of producibility in the manufacturing process of extruding sheds 60 (FIG. 3) over the outer jacket 68 and then forming a bond between the sheds and the outer jacket by heat shrinking both the sheds and the outer jacket. Particularly in applications involving the higher transmission voltages, such sheds beneficially increase the creepage distance and help prevent corona discharge.

The fiber optic cable assembly shown in FIG. 4, being composed essentially of plastic materials, has excellent flexibility, and thus can readily loop over horizontally and drop down vertically from the power line over to a ground terminus up on the steel transmission tower, as shown in FIG. 3.

However in some applications the fiber optic cable assembly may stand upright, that is, its long axis is normal to the plane of the earth's surface. In such a case, rigidity and compressive strength may be desirable. For such an application, the fiber optic cable configuration shown in FIG. 4 would be changed as follows: The flexible dielectric strength member 70, the dielectric shield intermediate jacket 66, and the outer jacket 68 would be replaced by a rigid outer support body made of a rigid, electrically insulating dielectric material, such as glass, or ceramic, or porcelain, which would provide the rigid mechanical strength, provide the dielectric strength, provide a protective weatherproof barrier, and have an outer surface in the form of sheds, similar to forms 60 or 51 in FIG. 3, to provide a favorably large creepage distance. Such a fiber optic data transmission assembly incorporating said rigid outer support body with a cable core comprising a combination of: data optical fibers, the optical fiber bundle of the radiant energy unit, and the resistive link of the voltage sensor voltage divider is called a rigid fiber optic bushing assembly.

The rigid outer support body has the mechanical strength to mechanically support not only the entire fiber optic cable assembly under the compression, tension, and torsion loads encountered in power system field use, but also to support the tensional load of the heavy suspended power line phase conductor, for those applications where the fiber optic cable components connect a line measuring station pod 52 on the phase conductor to the ground through the middle of a rigid outer support body, which body both mechanically supports the suspended phase conductor and insulates it from the ground. The rigid outer support body is shown as form 67 in FIG. 7, which shows a cross-sectional view of the rigid fiber optic bushing assembly. The rigid outer support body 67 replaces the dielectric strength member 70, the intermediate jacket 66, and the outer jacket 68 of the flexible fiber optic cable assembly shown in FIG. 4. This rigid fiber optic bushing assembly is shown in FIG. 7 as form 63. The phantom lines of form 63 in FIG. 3 show the solid core of the rigid fiber optic bushing assembly, the interior of which is shown in a cross sectional view in FIG. 7.

The rigid outer support body with sheds, typically would be made in a casting process. The inner and outer diameter of the sheds are shown as forms 25 and 15, respectively, in FIG. 7. The inner diameter of the sheds form 25 is the outer diameter of the solid core of the rigid fiber optic bushing assembly shown by phantom lines 63 in FIG. 3. The solid core contains optical fibers 72, 73, 74, 75, and 76, plus optical fiber bundle 87, voltage sensor resistive link 78, and outer shield resistive link 85 with shield rings 82, all of which are encapsulated within mastic matrix 65, as shown in FIG. 7.

Forms 63' and 63'', respectively, represent flexible fiber optic cable assemblies connecting the line measuring station pod 10 to the high voltage end of the rigid fiber optic bushing assembly, and connecting the ground voltage end of the rigid fiber optic bushing assembly to the ground terminus station 58. The voltage sensor voltage divider resistive link 83 is contained within the solid core of the rigid fiber optic bushing assembly, which assembly bridges across the high voltage gradient from the power line form 12 to the earth ground terminus, which is shown in FIG. 3 as a steel transmission tower form 56.

The rigid outer support body 67 is cast around two cylindrical shaped anchors 21, which are described further below, to form a strong unitized mechanical structure. The anchors are thus embedded within the center of the cross sectional area of the rigid outer support body 67 and along the long axis centerline of the rigid outer support body 67, but the anchors extend in length only roughly one foot or so in from each end of the rigid outer support body 67. When cast, the rigid outer support body 67 would have a hole, or cylindrical cavity, down the center along the entire length of the rigid outer support body extending from and connecting between the anchors 21 and equal in diameter to the inside diameter of the anchors. The cable core is thus contained in a conduit formed by the anchors 21 and the cylindrical cavity within the rigid outer support body 67, as shown in FIG. 7. The cable core contains all elements inside rigid outer support body 67, and is pulled through the cylindrical cavity within rigid outer support body 67 and is attached to the inner walls of the rigid outer support body 67 typically by a cement.

Alternatively, a urethane foam, after mixing its 2 liquid components, is injected into the cavity after the core is installed, and the expansion of the urethane as it hardens into a stiff foam will cause the foam to adhere to and rigidly hold the cable core to the walls of the rigid outer support body cylindrical cavity and anchor.

Thus, with the anchors 21, the rigid outer support body can mechanically support the large tensional load of the phase conductor which can be roughly 0.1 miles long and consist of one to four roughly 1½ inch diameter spiral bundles of small, roughly 1.0 inch diameter individual aluminum wires. In those applications, the phase conductor load is mechanically connected into the rigid outer support body anchor 21. Anchor 21 is typically a high strength cylindrical metal part which is cast into the rigid outer support body 67, and has outer walls with raised knurled bosses 23 whose large surface area improves the mechanical adherence and fastening of the anchor to the rigid outer support body 67 to yield a strong unibody construction. Thus, the cable core, that is, all components of FIG. 4 inside intermediate jacket 66 less the dielectric strength member 70, is contained within the anchor 21 in FIG. 7 on the ends of the rigid outer support body and within the rigid body 67 cylindrical cavity which extends from the interior end of the high voltage anchor to the interior end of the ground anchor at the ground end of the rigid outer support body 67 of bushing assembly 63, which is typically 1–5 meters in length depending on the magnitude of the power line voltage. The anchor, because it is typically composed of a high strength and high toughness metal alloy which is an electrical conductor, extends only a short distance into the dielectric rigid outer support body 67. For example, a 3 meter long rigid outer support body may have roughly a 0.3 meter long anchor. The anchor would connect on its high voltage end, or power line end, to a mechanical coupler, form 13 in FIG. 3, which is typically made of steel, and is of a type familiar to those knowledgeable in this art.

In general, for a high degree of voltage measurement accuracy and to minimize or eliminate the need for calibration, correction or compensation for changes in the resistance of the voltage divider as a function of changes in ambient temperature, the twin resistance resistive links $R_L$ 83 and $R_{Ls}$ 81 should have a very high precision resistance tolerance and a very low temperature coefficient of resistance. One preferred means of having a resistive link with both very high tolerance and very low TCR is to form the resistive link from a plurality of discrete resistors which can be assembled into a long string or filament and encapsulated within the cable assembly 54 running from the measuring station on the power line down to the ground. The discrete resistor elements would be chosen on the basis of having a very low TCR of less than 100 parts per million per degree Centigrade (ppm/°C.) and preferably in the range of 4–10 ppm/°C.; and also on the basis of having a high precision tolerance of less than one percent (%), and preferably 0.3%, or even in the range of 0.10% down to 0.01% accuracy.

The leads of the discrete resistors which are typically axial and are about ½ inch long can, for example, first be overlapped about ¼ inch, then as required the leads can be tied together rigidly with roughly 10 or so tightly wrapped loops of thin wire to form a firm compressive mechanical connection, and finally the leads can be soldered together to form a conductive electrical connection. Thus, for example, if 100 individual discrete resistors are connected in series into a single assembly, the total resistance of the assembly equals the sum of the individual resistances of the discrete resistors; and if each individual resistor has a 0.1% tolerance, the tolerance of the assembly is also 0.1%. Electrically conductive shield rings 82 can be readily connected both mechanically and electrically to outer shield resistive link 81 by methods described above.

After completion of the $R_L$ and $R_{Ls}$ resistive links and encapsulation within cable 54, the actual resistances of the resistive links can, as required, be calibrated by using an ampere meter to measure the current through the resistive link of the voltage sensor with the measuring station attached to a calibration test facility power line voltage of precisely known magnitude and high stability. Further, several measurements of the large resistance $R_L$ made at several different temperatures can establish or verify the variation of the resistance as a function of temperature.

Since the TCR function, the dependent variable resistance as a function of the independent variable temperature, is known, the TCR is used to correct the measured voltage data for changes in temperature. Typically, the slope of the TCR above and below 25° C. is parabolic. Thus if the TCR curve is a positive parabolic, the resistance increases proportionally for temperatures above 25° C., and, the resistance also increases proportionally for temperatures below 25° C. Likewise, if the TCR curve is a negative parabolic, the resistance decreases proportionally for temperatures above or below 25° C. Whichever the case, it is preferred that the TCR parabolic positive or negative curve slope direction, either positive or negative, for $R_s$ be the same as for $R_L$.

This resistive link TCR function can be programmed into signal processor and data transmission circuit 33, or more typically, into the ground receiving and data processing station 38 utilizing, for example, programmable read only memory (PROM) hardware to process the measured voltage data to correct or compensate for the TCR of the resistive link.

However, such calibration and/or compensation generally is not necessary to meet the typical one percent (1.0%) accuracy requirements of most non-metering voltage measurement applications provided that high precision tolerance low TCR discrete resistors are used since such resistors are accurate to well within 1.0% without pre-field use calibration or data processing compensation during field use. For example, using discrete resistors having a high precision tolerance at 25° C. of 0.1% and a 20 ppm/°C. TCR, then a 50° C. change in temperature, which is about the range of annual variation in ambient temperature experienced by power lines, causes an error of only 0.001 or 0.1% due to the TCR. Adding the TCR 0.1% error to the 0.1% tolerance error gives a total error of 0.2% which is well within the typical application 1.0% limit, and even within the desired 0.3% limit for voltage accuracy in precision revenue metering applications.

As an alternative to a resistive link formed of a plurality of discrete high precision low TCR resistors, the resistive links $R_L$ and $R_{Ls}$ can be made of predominantly ceramic material such as silicon carbide (SiC) in the form of continuous filaments of yarn composed of many individual fibers. In the fabrication of the SiC yarn, silicon reacts with fibers of carbon to form SiC. The electrical conductivity of the SiC is due primarily to the presence of residual carbon at the center core of the fibers.

The temperature coefficient (TCR) for a ceramic resistive link, such as SiC, is roughly the same as for the polymeric plastic type of resistive link. Typically, a one degree Centigrade change in temperature causes roughly a 0.2 to 1.8 percent change in the resistance of the polymeric plastic or of the ceramic types of resistive link. Such an unfavorably large change in resistance would proportionally change the voltage ratio of $R_L$ to $R_s$ and thus would proportionally degrade the accuracy of the voltage measurements. One way to avoid such accuracy loss is to correct or compensate for the change in resistive link resistance as a function of ambient temperature by having the ambient temperature sensor 28 send its data to the signal processor 33 to correct the measured voltage for changes in the resistance of the $R_L$ resistive link caused by changes in ambient temperature. In fact, the ambient temperature sensor is small enough, roughly 0.002 cubic inches, to be encased within the cable assembly outer jacket 68 where it is adjacent to the resistive link 78 and thus, is exposed to the same temperature as the resistive link.

However, because of the relatively high TCR of polymeric plastic and ceramic yarn types of filamentary resistive links, and because of the difficulty of mechanically fastening and electrically connecting the electrically conductive and typically metallic outer shield rings 82 to a $R_{Ls}$ outer shield resistive link made of a plastic or of a ceramic material, typically having $R_L$ and $R_{Ls}$ assembled from a plurality of high precision tolerance low TCR discrete resistors is preferred.

As an alternative to a type of filamentary voltage sensor voltage divider resistive link $R_L$ 83 in FIG. 1A, an outer shield resistive link 81 in FIG. 1A, said resistive link $R_L$ 83 can be a co-polymer or polymer dielectric solid plastic matrix in the form of a bar made electrically conductive by the presence of electrically conductive material, such as carbon or other conductive material which is evenly dispersed throughout the resistive link solid plastic bar. The conductive material could, alternatively, be distributed within mastic matrix 65, shown in FIGS. 4 and 7, allowing the mastic matrix to serve as the voltage sensor voltage divider resistive link, instead of a separate filament 78 for $R_L$. Further, since the mastic matrix 65 is linear in geometry (i.e. has no wraps or turns etc.) there will be minimum induction. In such a use of a very large ohmic resistance solid plastic bar or mastic matrix 65 as the voltage sensor resistive link $R_L$ 83, the outer shield resistive link $R_{Ls}$ 81 in FIG. 1A, shown as 85 in FIGS. 4 and 7, would still enclose $R_L$ 83 in FIG. 1A, which is shown as 78 in FIGS. 4 and 7, but would be shaped in a cylindrical or pipe shaped form, separated radially from $R_L$ 83 by an electrically insulating jacket similar to intermediate jacket 66 in FIG. 4, and would be made of the same very large ohmic resistance solid plastic bar or mastic matrix 65 material as is $R_L$ 83, but would have no shield rings 82 since its cylindrical or pipe shaped body encloses $R_L$ 83. Such a configuration offers the advantage of outer shield resistive link $R_{Ls}$ 81 being a favorably effective stray capacitance shield for voltage sensor resistive link $R_L$ 83, provided that $R_L$ 83 and $R_{Ls}$ 81 can be efficiently fabricated to have equal or matched resistances over each and every small segment along their entire lengths, from the overhead power line measuring station 10 down to the ground receiving and data processing station 38 which is typically a straight vertical drop, so that each point along the length of $R_L$ 83 is enclosed radially by a ring-shaped segment of $R_{Ls}$ 81 which is at the same voltage potential, and, provided the temperature coefficients of resistance of the very large ohmic resistance solid plastic bar or mastic matrix 65 material are acceptably small.

In FIG. 4, the resistive link fiber optic cable assembly dielectric strength member carries the tensile load, not the resistive link or optical fibers which are typically helically wrapped around the central strength member. There is little torsional twisting of the resistive link fiber optic cable assembly because of its construction and size, roughly one inch in diameter between the sheds with the shed diameter about four inches for a 230 KV power line phase conductor, and because it is free hanging from the monitor system measuring station housing up on the line down to the earth ground receiving station on the power line tower or some other ground location.

For a 230 KV power line, for example, the resistive link $R_L$ would typically have a total resistance of roughly two thousand (2,000) Megohms to permit a small but measurable current of about 0.1 mA to flow through the resistive link 78. In this case, the small resistance $R_s$ would typically have a resistance of roughly one hundred thousand ohms (100. K ohms). This will provide a voltage divider ratio of large resistance $R_L$ to small resistance $R_s$ of about twenty thousand to one (20,000:1).

For a 230 KV power line, for example, the resistive link filament of cable 54 typically can have a linear resistivity along its length of from roughly 2 to 8 Megohms per centimeter. Thus, for example, if the resistive link total resistance is 2,000 Megohms and its linear resistivity is 2 Megohms per cm., then its length would be about 1,000 cm. or 33 feet. The resistive link can be composed of polymeric plastic such as a fluoropolymer or of a ceramic material such as silicon carbide fibers in a filamentary shape, or it may be composed of an assembly of discrete resistors connected together in series in a long linear assembly. All three of those resistive link materials offer the necessarily wide range of linear resistivities necessary to measure voltage across the spectrum of voltages encountered in the power company lines.

As the power line voltage increases, proportionately higher resistive link linear resistivities are needed to keep the current in the 0.1 mA range for a given (fixed) resistive link length. In the case of polymeric plastics, to increase the linear resistivity, the concentration of the conductive carbon or other solute within the fluorocarbon or other plastic solvent matrix is decreased. For ceramic fibers such as SiC, to increase the linear resistivity, proportionately fewer fibers are used in the resistive link filament. For the case of the discrete resistor assembly, to increase the linear resistivity, higher resistance discrete resistors are used.

Whether fiber optic elements are included in cable 54, the resistive link is a separate bridge to ground independent of the data link. The flexible resistive link shown in FIG. 4 must be jacketed to provide mechanical and environmental protection. Jacketing materials such as polyurethane, tetrafluoroethylene, polytetrafluoroethylene or co-polymers of silicon rubber and polyethylene and ethyl vinyl acetate would be suitable, for example.

To correct for changes in $R_L$ 83 as a function of temperature as required, and for purposes of ampacity or dynamic thermal line rating applications, the temperature sensing circuit 26 converts the analog signal input from the line and ambient temperature sensors 22 and 28 multiplexing, and transmission along with the digital RMS voltage and current and phase angle measurement data by the signal processor and data transmission circuit 33 to the ground receiving and data processing station 38, where the measured temperature data is processed by the voltage processor circuitry within 38 to correct for changes in the resistance of $R_L$ 83 as a function of temperature, or by other processor circuitry within 38 for purposes of power line ampacity or dynamic thermal line rating measurements.

A fiber optic data link such as the cable assembly of FIG. 4 is preferred because it will enable two-way duplexing flow of data between the ground receiving and data processing station 38 and the signal processor and data transmission circuit 33. This will allow not only the flow of measure sample data from the measuring station up on the power line to the ground receiving station, but also the uplinking and downlinking of diagnostic and calibration data through the cable from the ground based station. Other data links, such as radio and optical-through-air do not feasibly offer this two-way duplexing data flow. For example, mounting a radio receiving antenna within the measuring station housing alters its shape and presents issues of corona and background noise interference from the power line. Optical-through-air transmitters and receivers are subject to the accumulation of films of contamination on the optical or lens surfaces and poor reception during atmospheric conditions of fog, dust, rain, sleet or snow and thus are not preferred.

Thus there has been disclosed a unique electric power transmission line monitoring system which will measure or monitor line voltage, line current, line electric field phasor, line phase angle, ambient and line temperature and provide outputs to data processor circuits to provide complete monitoring of all functions of power transmission lines.

Although referred to as a line monitoring system, typically, power company people buy such an instrument to do only a specific job, which is usually related to either system protection or to metering. Protection applications typically require the measurement of the instantaneous current, and sometimes also, of the instantaneous voltage and of the instantaneous phase angle; measurement of line harmonics and waveform analysis typically requires the measurement of the same instantaneous data. Metering applications typically require the measurement of RMS voltage and RMS current and RMS phase angle; load management and distribution automation applications typically require the measurement of the same RMS data. Line ampacity or dynamic thermal line rating applications require the measurement of the ambient and line temperatures plus, usually, the RMS current. Thus each line monitoring system instrument will typically be configured with only those sensors and circuitry and other components necessary to perform the specific job requirement.

The line monitoring system is compact and easy to install without the need for a line outage and without interfering with line operation. The system line measuring station circuitry can be powered direct from the AC power line via a current transformer and rectifier circuitry, and/or from the ground via the radiant energy unit consisting of a ground source, an optical fiber bundle, and a photovoltaic array converter. The system voltage sensor employs a voltage divider which has a unique shield device to reduce the effect of stray capacitance on the current in the voltage sensor voltage divider resistive link, and has unique measurement circuitry to correct for the effect of stray capacitance, by measuring the loss of current across the resistive link of the voltage sensor voltage divider.

The line monitoring system data link is preferably a fiber optic data transmission line configured as a flexible fiber optic cable assembly or as a rigid fiber optic bushing assembly. Said fiber optic data transmission line uniquely incorporates within a unibody construction the voltage sensor voltage divider resistive link, and/or the optical fiber bundle of the radiant energy unit, which provides long term ground based power to operate the line measuring station circuitry when the power line is out of service for up to one year or more.

This invention is not to be limited by the embodiment shown in the drawings and described in the description which is given by way of example and not of limitation, but only in accordance with the scope of the appended claims.

What is claimed is:

1. A power transmission line monitoring system comprising;
   current sampling means for sampling current on a power transmission line;
   rectifying means for rectifying the output of said current sampling means;
   power supply means connected to the output of said rectifying means for producing regulated filtered electrical power;
   line voltage sensing means connected to said power transmission line, said line voltage sensing means including a voltage divider comprised of a small resistance connected to said power transmission line in series with a very large resistance connected to earth ground;
   signal processing means for receiving and processing the data output of said line voltage sensing means, signal processing means including data processing and data transmission means for transmitting said data output of said line voltage sensing means across the line to ground voltage gradient to a ground receiving and data processing station located remotely from said power transmission line, said data transmitting means comprising a fiber optic data transmission cable that includes said very large resistance of said voltage divider;
   voltage divider current loss measuring circuit means for measuring current loss across said voltage divider by the continuous measurement and comparison of the current magnitude at the power line end of said line voltage sensing voltage divider with the current magnitude at the earth ground end of said line voltage sensing voltage divider, said comparison data processing performed at said ground receiving and data processing station, said voltage divider power line end current magnitude measured by said line voltage sensing means, and said voltage divider earth ground end current magnitude measured by a voltage divider earth ground end current sensing circuit means, said voltage divider earth ground end current sensing circuit means being part of said ground receiving and data processing station; and
   a common system return connecting said current sampling means, said rectifying means, said power supply means, said line voltage sensing means, and said signal processing means to said power transmission line whereby system circuits are isolated from earth ground by using the power transmission line as a reference and as the common system circuitry return.

2. The power line monitoring system according to claim 1 wherein said line voltage sensing means data output is in analog real time waveform units received by said signal processing and data transmitting means for processing and transmitting, said transmission means transmitting said analog real time waveform units in real time analog form, from the output of an AC to RMS converter circuit means in analog form.

3. The power transmission line monitoring system according to claim 2 including stray capacitance compensating circuitry means for reducing the amount of current loss from said voltage divider.

4. The power transmission line monitoring system according to claim 3 wherein said stray capacitance compensating circuitry means comprises a second outer twin resistance voltage divider parallel to the first inner voltage divider, said second outer twin resistance voltage divider comprised of a small resistance connected to said power transmission line in series with a very large resistance connected to earth ground, said second outer twin resistance voltage divider being coupled to said first inner line voltage sensing voltage divider by shield means.

5. The power transmission line monitoring system according to claim 4 wherein said shield means electrically coupling said first inner line voltage sensing voltage divider to said second outer twin resistance voltage divider comprises a series of spaced shield rings connected to said second outer voltage divider with each individual shield ring forming a closed earth enclosing a small linear segment of the length of said first inner line voltage sensing voltage divider, with the spatial orientation of the geometric plane formed within said closed path roughly parallel to the plane of the earth ground surface below said first inner line voltage sensing voltage divider small linear segment.

6. The power transmission line monitoring system according to claim 5 including a line electrostatic field meter means for measuring the line electric field phasor connected to said common system return, said electric field. phasor data output from said line electrostatic field meter means is in real time analog waveform units to phase angle sensing circuit means with said phase angle sensing circuit means having an analog data output to said signal processor means, and also to said signal processor means directly for receiving, processing and transmitting of said electric field phasor real time analog waveform data output as a real time analog waveform, said data transmitting means of said signal processor means comprising a fiber optic data transmission cable.

7. The power line monitoring system according to claim 6 including an ambient temperature sensing means thermally coupled to the ambient air adjacent to the power transmission line for sensing the ambient air temperature, said ambient temperature sensing means circuitry connected to said common system return, with analog ambient temperature data being output to signal processing means for receiving, processing, and transmission of said data to a ground receiving and data processing station located remotely from said power transmission line, said data transmitting means comprising a fiber optic data transmission cable.

8. The power line monitoring system according to claim 7 including a radiant energy unit comprising an alternative electrical energy source for supplying electrical power to the line monitoring system circuitry, with electrical power from said line current sampling means.

9. The power line monitoring system according to claim 8 in which said radiant energy unit comprises;
   an optical radiant energy means;
   an optical radiant energy transmission medium means for containing, routing, and transmission of said radiant energy across the ground to line voltage gradient from said radiant energy source, said optical radiant energy transmission medium means contained within and a component of said fiber optic data transmission cable; and a photovoltaic array mounted on said power transmission line optically coupled to said optical radiant energy transmission medium means to receive said incident optical radiant energy, and to convert said optical radiant energy into electrical energy, which is connected to and is referenced to said common system return.

10. The power line monitoring system according to claim 9 in which said optical radiant energy transmission medium means comprises an optical radiant energy conducting optical fiber bundle, said optical fiber bundle assembled from a plurality of discrete optical fibers, said optical fiber bundle optically coupling and connecting said photovoltaic array to said optical radiant energy source means contained within and a component of said fiber optic data transmission cable.

11. The power line monitoring system according to claim 10 in which said optical radiant energy source means is an incandescent lamp.

12. The power line monitoring system according to claim 11 including a battery for storing electrical power being said electrical power available to supply said line monitoring system circuitry during the time period of any transitions from power supplied by said current sampling means over to power supplied from said radiant energy unit, said battery connected to and referenced to said common system return.

13. A power transmission line monitoring system comprising;
   current sampling means for sampling current on a transmission line;
   rectifying means for rectifying the output of said current sampling means;
   power supply means connected to the output of said rectifying means for producing regulated filtered electrical power;
   line current sensing means connected to said rectifying means for sensing line current;
   signal processing means for receiving and processing the data output of said line current sensing means, signal processing means including data processing and data transmission means for transmitting said data output of said line current sensing means to a ground receiving and data processing station located remotely from said power transmission line, said data transmission means comprising a fiber optic data transmission cable; and
   a common system return connecting said current sampling means, said rectifying means, said power supply means, said line current sensing means, and said signal processing means to said power transmission line whereby system circuits are isolated from earth ground by using the power transmission line as a reference and as the common system circuitry return.

14. The power transmission line monitoring system according to claim 13, wherein said line current sensing means data output in analog real time waveform units received by said signal processing and data transmitting means for analog processing and transmitting, said transmission means transmitting said real time waveform units in real time analog form, Ac to true RMS converter circuit means in analog form.

15. The power transmission line monitoring system according to claim 14 including a line electrostatic field meter means for measuring the line electric field phasor connected to said common system return, said electric field phasor data output from said line electrostatic field meter means is in real time analog waveform units to phase angle sensing circuit means with said phase angle sensing circuit means having an analog data output to said signal processor means, and also to said signal processor means directly for receiving, processing and transmitting of said electric field phasor real time analog waveform data output as a real time analog waveform, said data transmitting means of said signal processor means comprising a fiber optic data transmission cable.

16. The power line monitoring system according to claim 15 including a radiant energy unit comprising an alternative electrical energy source for supplying electrical power to the line monitoring system circuitry, with electrical power from said line current sampling means.

17. The power line monitoring system according to claim 16 in which said radiant energy unit comprises:
   an optical radiant energy means;
   an optical radiant energy transmission medium means for containing, routing, and transmission of said radiant energy across the ground to line voltage gradient from said radiant energy source, said optical radiant energy transmission medium means contained within and a component of said fiber optic data transmission cable;
   a photovoltaic array mounted on said power transmission line optically coupled to said optical radiant energy transmission medium means to receive said incident optical radiant energy, and to convert said optical radiant energy into electrical energy, which is connected to and is referenced to said common system return.

18. The power line monitoring system according to claim 17 in which said optical radiant energy transmission medium means comprises an optical radiant energy conducting optical fiber bundle, said optical fiber bundle assembled from a plurality of discrete optical fibers, said optical fiber bundle optically coupling and connecting said photovoltaic array to said optical radiant energy source means contained within and a component of said fiber optic data transmission cable.

19. The power line monitoring system according to claim 18 in which said optical radiant energy source means is an incandescent lamp.

20. The power line monitoring system according to claim 19 including a battery for storing electrical power being said electrical power available to supply said line monitoring system circuitry during the time period of any transitions from power supplied by said current sampling means over to power supplied from said radiant energy unit, said battery connected to and referenced to said common system return.

21. A power transmission line monitoring system comprising;
   current sampling means for sampling current on a transmission line;
   rectifying means for rectifying the output of said current sampling means;
   power supply means connected to the output of said rectifying means for producing regulated filtered electrical power;
   line temperature sensing means connected to said power transmission line for sensing power transmission line phase conductor temperature;
   signal processing means for receiving and processing the data output of said line temperature sensing means, signal processing means including data processing and data transmission means for transmitting said data output of said line temperature sensing means to a ground receiving and data processing station located remotely from said power transmission line, said data transmission means comprising a fiber optic data transmission cable; and a common system return connecting said current sampling means, said rectifying means, said power supply means, said line temperature sensing means, and said signal processing means to said power transmission line whereby system circuits are isolated from earth ground by using the power transmission line as a reference and as the common system circuitry return.

22. The power line monitoring system according to claim 21 including a line current sensing means is connected to said rectifying means for sensing line current, and connected to and referenced to said common system return, with real time analog current waveform data output to signal processing means for receiving and processing the data output of said line current sensing means, signal processing means including data processing and data transmission means for transmitting said data output of said line current sensing means to a ground receiving and data processing station located remotely from said power transmission line, said data transmitting means comprising a fiber optic data transmission cable, and said transmitting means transmitting said current data output in real time waveform units from the output of AC to true RMS converter circuit.

23. The power line monitoring system according to claim 22 including an ambient temperature sensing means thermally coupled to the ambient air adjacent to the power transmission line for sensing the ambient air temperature, said ambient temperature sensing means circuitry connected to and referenced to said common system return, with analog ambient temperature data being output to signal processing means for receiving, processing, and transmission of said data output to a ground receiving and data processing station located remotely from said power transmission line, said transmitting means comprising a fiber optic data transmission cable.

24. A power transmission line monitoring system comprising;

current sampling means for sampling current on a power transmission line;

rectifying means for rectifying the output of said current sampling means;

power supply means connected to the output of said rectifying means for producing regulated filtered electrical power;

line current sensing means connected to said rectifying means for sensing line current;

line voltage sensing means connected to said power transmission line, said line voltage sensing means including a voltage divider comprised of a small resistance connected to said power transmission line in series with a very large resistance connected to earth ground;

line electrostatic field meter means for measuring the line electric field phasor;

signal processing means for receiving the data output of and for processing the data output of said line current sensing means, said line voltage sensing means, and said line electrostatic field meter means, said signal processing means including data processing and data transmitting means for transmitting said data output across the line to ground voltage gradient to a ground receiving and data processing station located remotely from said power transmission line, said data transmitting means comprising a fiber optic data transmission cable that includes said very large resistance of said voltage divider;

voltage divider current loss measuring circuit means for measuring current loss across said voltage divider by the continuous measurement and comparison of the current magnitude at the power line end of said line voltage sensing voltage divider with the current magnitude at the earth ground end of said line voltage sensing voltage divider, said comparison data processing performed at said ground receiving and data processing station, said voltage divider power line end current magnitude measured by said line voltage sensing means, and said voltage divider earth ground end current magnitude measured by a voltage divider earth ground end current sensing circuit means, said voltage divider earth ground end current sensing circuit means part of said ground receiving and data processing station; and a common system return connecting said current sampling means, said rectifying means, said power supply means, said line current sensing means, said line voltage sensing means, said line electrostatic field meter means, and said signal processing means to said power transmission line whereby system circuits are isolated from earth ground by using the power transmission line as a reference and as the common system circuitry return.

25. The power line monitoring system according to claim 24 wherein said line circuit sensing means, and said line electrostatic field meter means data output in real time waveform units is received by said signal processing and data transmitting means for processing and transmitting, said data transmitting means transmitting said real time waveform units from the output of an AC to turn RMC converter circuit means and in RMS phase angle units from the output of a line phase angle sensing circuit means, said line phase angle sensing circuit means receiving a real time waveform data input of line current from said line current sensing means of the line electric field phasor from said line electrostatic field meter means, and of the line voltage from said line voltage sensing means.

26. The power transmission line monitoring system according to claim 25 including stray capacitance compensating circuitry means for reducing the amount of current loss from said line voltage sensing voltage divider.

27. The power transmission line monitoring system according to claim 26 wherein said stray capacitance compensating circuitry means comprises a second outer twin resistance voltage divider parallel to the first inner voltage divider, said second outer twin resistance voltage divider comprised of a small resistance connected to said power transmission line in series with a very large resistance connected to earth ground, said second outer twin resistance voltage divider being coupled to said first inner line voltage sensing voltage divider by shield means.

28. The power transmission line monitoring system according to claim 27 wherein said shield means electrically coupling said first inner line voltage sensing voltage divider to said second outer twin resistance voltage divider comprises a series of spaced shield rings connected to second outer voltage divider with each individual said shield ring forming a closed path enclosing a small linear segment of the length of said first inner line voltage sensing voltage divider, with the spatial orientation of the geometric plane formed within said closed path roughly parallel to the plane of the earth ground surface below said first inner line voltage sensing voltage divider small linear segment.

29. The power transmission line monitoring system according to claim 28 including ambient temperature sensing means thermally coupled to the ambient air adjacent to the power transmission line for sensing the ambient air temperature, said ambient temperature sensing means circuitry connected to said common system return, with analog ambient temperature data output to signal processing means for receiving, processing, and transmission of said data to a ground receiving and data processing station located remotely from said power transmission line, said transmitting means comprising a fiber optic data transmission cable.

30. The power transmission line monitoring system according to claim 29 including a line temperature sensing means connected to said power transmission line for sensing power transmission line phase conductor temperature, with analog data output from said line temperature sensing means to temperature sensing circuit means, said circuit means having an analog data output to said signal processing means, said signal processing means including analog or digital data processing and analog or digital data transmission means for transmitting said data output of said line temperature sensing means to a ground receiving and data processing station located remotely from said power transmission line, said data transmitting means comprising a fiber optic data transmission cable, and said line temperature sensing means and temperature sensing circuit means connected to and referenced to said common system return.

31. The power transmission line monitoring system according to claim 30 including a radiant energy unit comprising an alternative electrical energy source for supplying electrical power to the line monitoring system circuitry, with electrical power from said line current sampling means.

32. The power transmission line monitoring system according to claim 31 in which said radiant energy unit comprises:
an optical radiant energy means;
an optical radiant energy transmission medium means for the containing, routing, and transmission of said radiant energy across the ground to line voltage gradient from said radiant energy source, said optical radiant energy transmission medium means contained within and a component of said fiber optic data transmission cable;
a photovoltaic array mounted on said power transmission line optically coupled to said optical radiant energy transmission medium means to receive said incident optical radiant energy, and to convert said optical radiant energy into electrical energy, which is connected to and is referenced to said common system return.

33. The power transmission line monitoring system according to claim 32 in which said optical radiant energy transmission medium means comprises an optical radiant energy conducting optical fiber bundle, said optical fiber bundle assembled from a plurality of discrete optical fibers, said optical fiber bundle optically coupling and connecting said photovoltaic array to said optical radiant energy source means contained within and a component of said fiber optic data transmission cable.

34. The power transmission line monitoring system according to claim 33 which said optical radiant energy source means is an incandescent lamp.

35. The power transmission line monitoring system according to claim 34 including a battery for storing electrical power, said electrical power being available to supply said line monitoring system circuitry during the time period of any transitions from power supplied by said current sampling means over to power supplied from said radiant energy unit, said battery connected to and referenced to said common system return.

36. A flexible high voltage gradient bridging dielectric optical data transmission fiber optic assembly for transmitting optical data across, and for enabling a very large resistance of a voltage sensing voltage divider to be routed across, a high voltage gradient which comprises within the cable assembly;
a voltage sensing voltage divider vary large resistance elongated resistive link;
data transmission optical fibers;
a mastic matrix for encapsulating optical fibers;
a polymeric dielectric strength member;
a polymeric insulating jacket; and
a series of polymeric insulating sheds along the length of the outer surface of said cable.

37. The cable assembly according to claim 36 in which said mastic matrix, strength member, insulating sheds, and insulating jacket components are provided by fewer than four components.

38. The cable assembly according to claim 36 in which said elongated resistive link is comprised of a continuous resistive link filament means.

39. The cable assembly according to claim 38 in which said continuous resistive link filament means is an electrically conductive plastic selected from the group consisting of a polymer and co-polymer.

40. The cable assembly according to claim 38 in which said continuous resistive link filament means is an electrically conductive ceramic material with an excess of electrically conductive material.

41. The cable assembly according to claim 38 in which said continuous resistive link filament means is a plurality of series-connected discrete high precision tolerance low temperature coefficient of resistance resistors.

42. The cable assembly according to claim 36 in which contains and includes an optical radiant energy transmission medium means for containing, routing and conducting optical radiant energy across said high voltage gradient.

43. The cable assembly according to claim 42 in which said optical radiant energy transmission medium means comprises an optical radiant energy conducting optical fiber bundle assembled from a plurality of optical fibers.

44. The cable assembly according to claim 43 in which said optical radiant energy transmission medium means comprises an optical radiant energy conducting cast polymer body.

* * * * *